(12) United States Patent
Tanaka

(10) Patent No.: US 10,541,041 B2
(45) Date of Patent: Jan. 21, 2020

(54) SEMICONDUCTOR DEVICE

(71) Applicant: Renesas Electronics Corporation, Tokyo (JP)

(72) Inventor: Shinji Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/947,992

(22) Filed: Apr. 9, 2018

(65) Prior Publication Data
US 2018/0342308 A1 Nov. 29, 2018

(30) Foreign Application Priority Data
May 25, 2017 (JP) ................................. 2017-103799

(51) Int. Cl.
*G11C 7/00* (2006.01)
*G11C 29/20* (2006.01)
*G11C 29/10* (2006.01)
*G01R 31/3181* (2006.01)
*G11C 7/10* (2006.01)

(52) U.S. Cl.
CPC ........ *G11C 29/20* (2013.01); *G01R 31/31813* (2013.01); *G11C 29/10* (2013.01); *G11C 7/1096* (2013.01)

(58) Field of Classification Search
CPC ......... G11C 29/20; G11C 29/10; G11C 29/46; G11C 7/1096; G01R 31/31813
USPC ....................................................... 365/201
See application file for complete search history.

(56) References Cited

U.S. PATENT DOCUMENTS

| | | | | | |
|---|---|---|---|---|---|
| 4,888,772 | A | * | 12/1989 | Tanigawa | G11C 29/34 714/719 |
| 5,029,330 | A | * | 7/1991 | Kajigaya | G11C 11/408 365/201 |
| 5,367,492 | A | * | 11/1994 | Kawamoto | G11C 7/20 365/190 |
| 5,400,342 | A | * | 3/1995 | Matsumura | G11C 29/34 365/200 |
| 5,455,796 | A | * | 10/1995 | Inui | G11C 29/34 365/201 |

(Continued)

FOREIGN PATENT DOCUMENTS

| | | |
|---|---|---|
| JP | 5-342113 A | 12/1993 |
| JP | 6-325600 A | 11/1994 |

*Primary Examiner* — Viet Q Nguyen
(74) *Attorney, Agent, or Firm* — McDermott Will & Emery LLP

(57) ABSTRACT

A semiconductor device is comprised of a memory cell array with multiple memory cells arranged in a matrix, multiple bit-line pairs provided for each memory cell column in the memory cell array, multiple input/output circuits provided respectively corresponding to the multiple bit-line pairs, and as interface control circuit that controls the data input/output to the multiple input/output circuits when performing the data write and data read for each memory cell row in a normal mode. The interface control circuit is comprised of a selection circuit. When the data write and data read are performed for each memory cell row in a test mode, the selection circuit selects the data input/output to one of first input/output circuit and a second input/output circuit, respectively corresponding to a first memory cell included in the memory cell row and a second memory cell adjoining the first memory cell, according to a test address.

9 Claims, 13 Drawing Sheets

(56) References Cited

U.S. PATENT DOCUMENTS

| | | | | |
|---|---|---|---|---|
| 5,574,693 A * | 11/1996 | Inui | ............................ | G11C 8/08 |
| | | | | 365/201 |
| 5,812,469 A * | 9/1998 | Nadeau-Dostie | ...... | G11C 29/28 |
| | | | | 365/201 |
| 5,812,473 A * | 9/1998 | Tsai | ...................... | G11C 7/1072 |
| | | | | 365/190 |
| 5,844,914 A * | 12/1998 | Kim | ........................ | G11C 29/18 |
| | | | | 714/718 |
| 5,848,017 A * | 12/1998 | Bissey | ...................... | G11C 7/06 |
| | | | | 365/201 |
| 5,856,982 A * | 1/1999 | So | ............................ | G11C 29/10 |
| | | | | 365/201 |
| 6,301,169 B1 * | 10/2001 | Kikuda | .................. | G11C 7/1006 |
| | | | | 365/189.02 |
| 6,529,428 B2 * | 3/2003 | Oh | ........................... | G11C 29/34 |
| | | | | 361/302 |
| 6,608,783 B2 * | 8/2003 | Frankowsky | .......... | G11C 7/1006 |
| | | | | 365/189.05 |
| 6,646,936 B2 * | 11/2003 | Hamamatsu | ............ | G11C 29/46 |
| | | | | 365/201 |
| 7,154,793 B2 * | 12/2006 | Sommer | .................... | G11C 7/18 |
| | | | | 365/201 |
| 9,741,455 B1 * | 8/2017 | Park | ........................ | G11C 29/76 |
| 2013/0048680 A1 * | 2/2013 | Tu | ............................ | G01F 11/34 |
| | | | | 222/310 |
| 2013/0170308 A1 * | 7/2013 | Mori | ........................ | G11C 29/00 |
| | | | | 365/201 |

\* cited by examiner

FIG. 6A

MEMORY (MUX1) OF COMPARATIVE EXAMPLE

ALL COLUMNS ARE CHOSEN → DATA GARBLING IN ADJOINING COLUMN DUE TO DATA WRITE CANNOT BE DETECTED

FIG. 6B

MEMORY (MUX1) OF PRESENT APPLICATION IN TEST MODE

ACCORDING TO ADDRESS TA[0], 0TH COLUMN (LEFT) OR 1ST COLUMN (RIGHT) IS CHOSEN

SEMICONDUCTOR DEVICE

CROSS-REFERENCE TO RELATED APPLICATIONS

The disclosure of Japanese Patent Application. No. 2017-103799 filed on May 25, 2017 including the specification, drawings, and abstract is incorporated herein by reference in its entirety.

BACKGROUND

The present disclosure relates to a semiconductor device, and, in particular, relates to a semiconductor device provided with a test mode.

In order to facilitate a functional test of a RAM mounted in a custom LSI, a BIST (Built-in Self Test) circuit has been attracting attention. In this technique, a test circuit (BIST circuit) is mounted in an LSI, and a RAM test is automatically performed inside the LSI. The BIST circuit has the following advantages.

An expensive tester is not required (it is not necessary to generate a test pattern in the external of the LSI). In the test of a RAM for which a direct test from the external of the LSI is difficult, high quality of the test (a high degree of the failure detection rate) is obtained. Since the BIST circuit is mounted in a chip, it is necessary that the BIST circuit itself can be realized with a small amount of hardware. It is also necessary that the BIST circuit itself can support various kinds of word-bit configurations flexibly, in order to satisfy the specification of a RAM used.

In this respect, a marching test is well know as one of the tests of a RAM (Patent Literatures 1 and 2).

It is said that the marching test is effective in the detection of a cell failure. Specifically, it is possible to detect the inter-cell interference such as interference to other surrounding cells, due to short-circuit with an adjacent cell, sneaking from a sense line, or leak of a defective cell.

In order to execute the marching test, in the general method, a test pattern of read and write of a memory cell is executed in all the addresses one by one, and it is possible to detect whether data of an adjoining un-selected memory cell is not reversed when data write is executed to a memory cell of a certain selected address.

(Patent Literature 1) Japanese Unexamined Patent Application Publication No. Hei 5(1993)-342113

(Patent Literature 2) Japanese Unexamined Patent Application Publication No. Hei 6(1994)-325600

SUMMARY

On the other hand, there is a tendency that applications with a large bit width are increasing in recent years, and a memory with a large bit width is requested in a RAM of the LSI.

Specifically, a memory (MUX1) with only a row address assigned as the address and without a column address is requested.

In the memory concerned, the problem is that all the memory cells in the row direction become in a selected state by the assignment of the address, and that it is difficult to bring only the adjoining memory cell into an un-selected state.

It is also possible to execute a pseudo marching test using a special test pattern. However, the problem is that it is necessary to mount an exclusive-use test pattern in the BIST circuit, accompanied by an increased cost.

The purpose of the present disclosure is to provide a semiconductor device that can execute the test with a simple system for solving the problems described above.

The other issues and new features of the present invention will become clear from the description of the present specification and the accompanying drawings.

According to one embodiment, a semiconductor device includes: a memory cell array with plural memory cells arranged in a matrix; plural bit-line pairs provided for each memory cell column in the memory cell array; plural input/output circuits provided respectively corresponding to the bit-line pairs; and an interface control circuit. The interface control circuit controls the data input/output to the input/output circuits when executing data write and data read to each memory cell row in a normal mode. The interface control circuit includes a selection circuit that selects the data input/output to one of a first input/output circuit and a second input/output circuit according to a test address, when executing the data write and data read to each memory cell row in a test mode. Here the first input/output circuit corresponds to a first memory cell included in a memory cell row and the second input/output circuit corresponds to a second memory cell adjoining the first memory cell.

According to one embodiment, in a normal mode, it is possible for the interface control circuit to control the data input/output to the input/output circuits when executing data write and data read to each memory cell row. In a test mode, it is also possible for the interface control circuit to select the data input/output to one of the first input/output circuit and the second input/output circuit, respectively corresponding to the first memory cell included in a memory cell row and the second memory cell adjoining the first memory cell, according to the test address. Therefore, it is possible to execute the test by a simple system.

BRIEF DESCRIPTION OF THE DRAWINGS

FIG. 6A and FIG. 6B are conceptual diagrams illustrating the marching test according to Embodiment 1;

DETAILED DESCRIPTION

Figure 1:
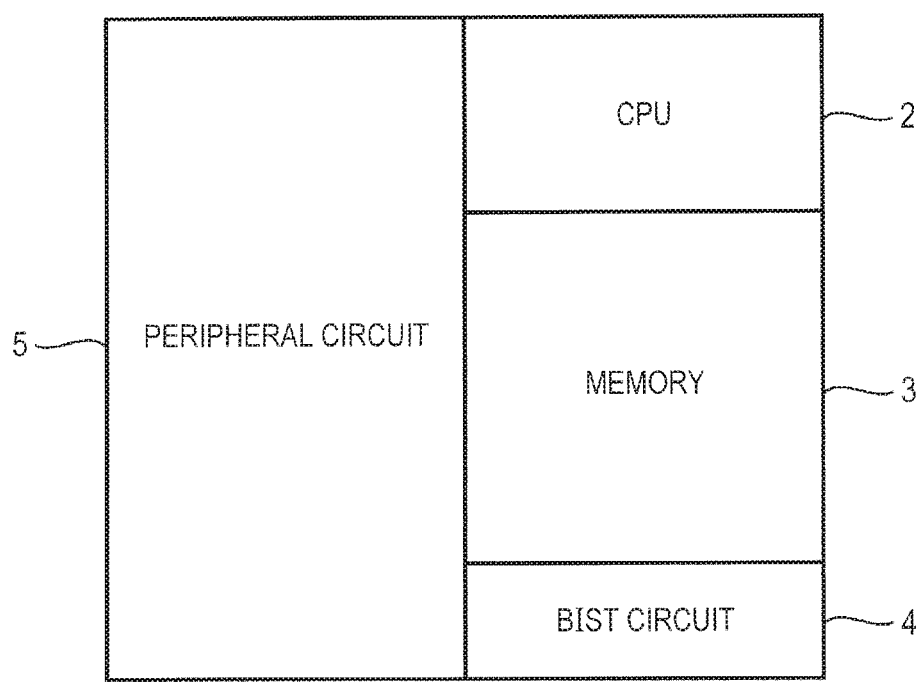
FIG. 1 is an appearance diagram illustrating a configuration of a semiconductor chip 1 according to Embodiment 1.

The present embodiment is explained in detail, referring to the accompanying drawings. In the following explanation, the same symbol or reference numeral is attached to the same element or the corresponding element and the repeated explanation thereof may be omitted.

(Embodiment 1)

FIG. 1 is an appearance diagram illustrating a configuration of a semiconductor chip 1 according to Embodiment 1.

FIG. 1 illustrates a semiconductor device or a semiconductor integrated circuit (LSI) so called an SOC (System On a Chip) in which various kinds of logic circuits and a memory device are formed in one semiconductor chip 1 such as single crystal silicon.

The semiconductor chip 1 is a vehicle control LSI for example, and it includes a CPU (Central Processing Unit) 2 as a processor unit, a memory 3 as a memory device, a peripheral circuit 5, and a BIST circuit 4 as a test circuit.

The CPU 2 performs predetermined arithmetic processing based on a program stored in the memory 3. The peripheral circuit 5 performs processing of a signal received from a sensor, generation of a signal for controlling an actuator, and transmit and receive of a signal with an in-vehicle network (CAN, LIN), for example.

The memory 3 is properly accessed in connection with the processing of such circuit blocks and is utilized as a primary storing area of data.

The peripheral circuit 5 includes such as a sensor and a clock circuit that generates a clock signal for synchronization.

The BIST circuit 4 executes a marching test as an example, for detecting the inter-cell interference such as interference to other surrounding cells, due to short-circuit with an adjacent cell, sneaking from a sense line, or leak of a defective cell.

In semiconductor devices, such as the SOC, it is possible to design the memory 3 by an automated design tool called a memory compiler, etc., using the design data called memory IP (Intellectual Property), for example.

(A Configuration of the Memory 3)

Figure 2:
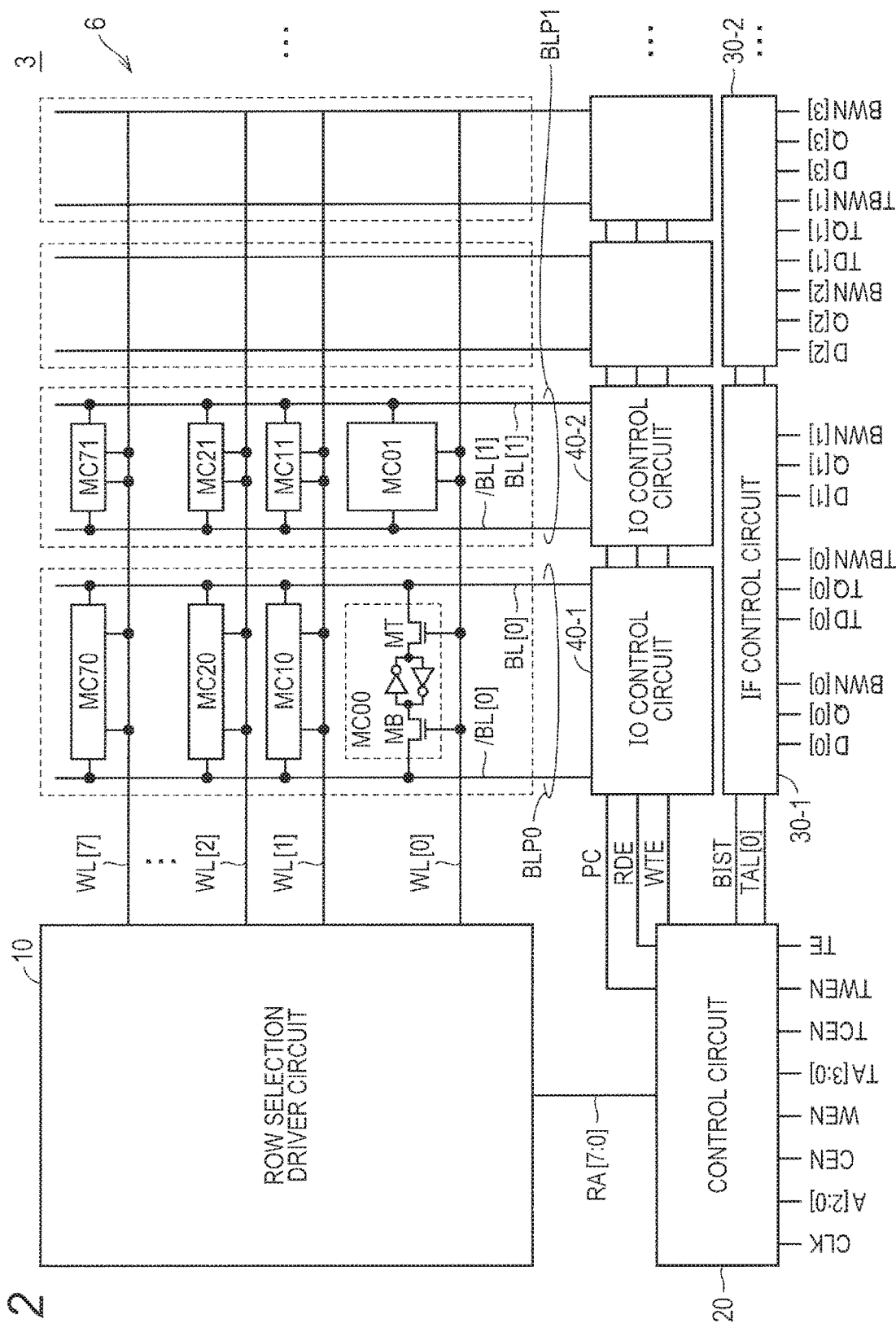
FIG. 2 is a drawing illustrating a configuration of a memory 3 according to Embodiment 1.

FIG. 2 is a drawing illustrating a configuration of the memory 3 according to Embodiment 1.

With reference to FIG. 2, the memory 3 is comprised of a memory cell array 6 including memory cells MC arranged in a matrix, a row selection driver circuit 10, a control circuit 20 to control the whole memory 3, multiple IO (input-output) control circuits 40, and multiple IF (interface) control circuits 30.

The memory cell array 6 includes multiple memory cells MC arranged in a matrix. Each memory cell MC is an SRAM (Static Random Access Memory) cell that is rewritable. An SRAM cell of six transistors may be used as an example. The details of the SRAM cell are publicly known; therefore, the detailed explanation thereof is omitted.

In the present example, a memory cell MC at the 0th row and the 0th column is marked as a memory cell MC00 as the address. A memory cell MC at the 0th row and the 1st column is marked as a memory cell MC01. A memory cell MC at the 1st row and the 0th column is marked as a memory cell MC10. The same system applies to the other memory cells MC.

As an example, memory nodes MB and MT of the memory cell MC00 are shown, and the potential of the memory nodes concerned are held. Data "1" is stored when the memory node MB is at an "L" level and the memory node MT is at an "H" level. On the other hand, data "0" is stored when the memory node MB is at the "H" level and the memory node MT is at the "L" level. It is also possible to reverse the data "0" and the data "1."

Multiple word lines WL are provided for each memory cell row. The present example shows a case where eight word lines WI[0]-WI[7] are provided.

Multiple bit-line pairs BLP are provided for each memory cell column. The present example shows a case where bit-line pairs BLP[0], BLP[1], and . . . are provided. The bit-line pair BLP includes bit lines BL and /BL.

The control circuit 20 controls the whole memory 3. The control circuit 20 executes a predetermined operation in response to the input of a clock signal CLK, an address A[2:0], a control signal CEN, a control signal WEN, a test address TA[3:0], a control signal TCEN, a control signal TWEN, and a control signal TE. In the present specification, the notation of [X:Y] expresses "from [Y] to [X]."

Specifically, the control circuit 20 outputs a row address signal RA[7:0] to the row selection driver circuit 10. The row selection driver circuit 10 selects a word line WL according to the row address signal RA[7:0]. In the present example, the row selection driver circuit 10 selects one word line WL out of eight word lines WL[0]-WL[7].

The control circuit 20 outputs appropriately a control signal PC, a control signal RDE (read control signal), a control signal WTE (write control signal), a control signal BIST (test control signal), and a control signal TAL[0], based on the input signals.

Multiple IO control circuits 40 are provided for each memory cell column. The present example shows a case where the IO control circuits 40-1, 40-2, and . . . are provided.

Multiple IF control circuits 30 are provided each two adjoining IO control circuits 40. The present example shows a case where the IF control circuits 30-1, 30-2, and . . . are provided.

(A Configuration of the Control Circuit)

Figure 3:
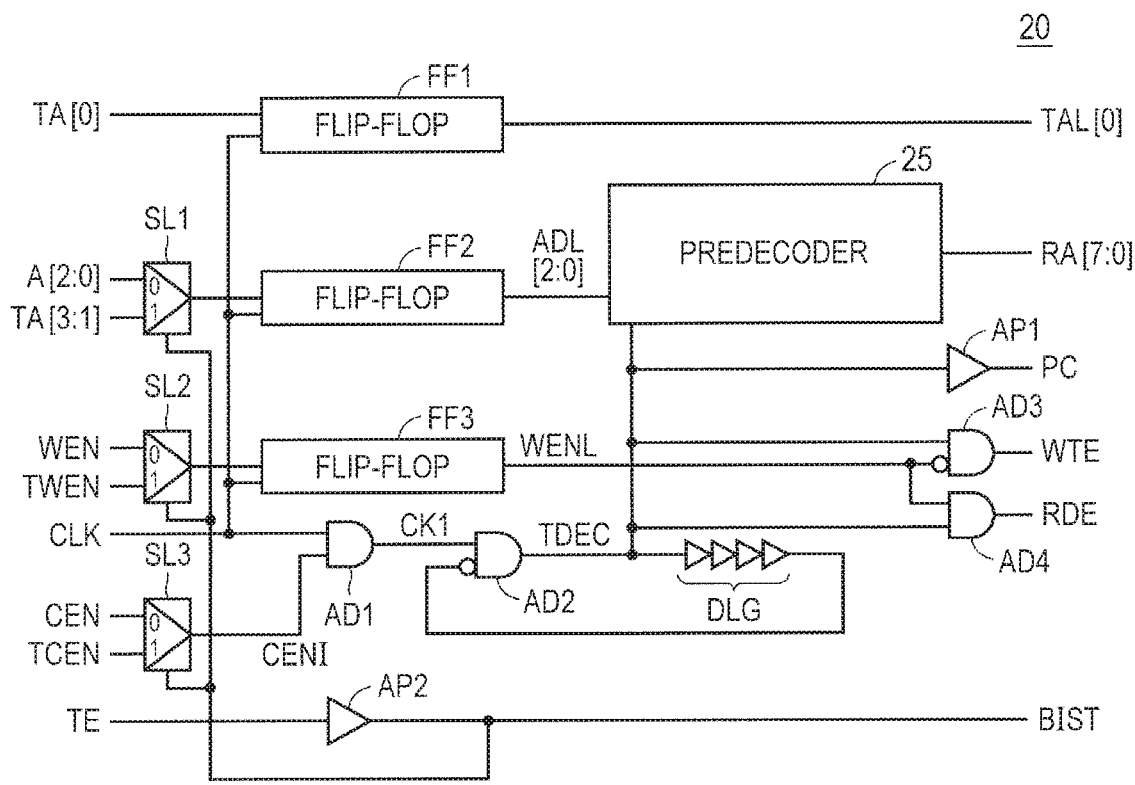
FIG. 3 is a drawing illustrating a circuit diagram of a control circuit 20 according to Embodiment 1.

FIG. 3 is a drawing illustrating a circuit diagram of the control circuit 20 according to Embodiment 1.

With reference to FIG. 3, the control circuit 20 is comprised of selectors SL1-SL3, flip-flops FF1-FF3, AND circuits AD1-AD4, amplifiers AP1 and AP2, a delay stage DLG, and a predecoder 25.

The flip-flops FF1-FF3 latch and output input data in response to the input of the clock signal CLK, respectively.

The flip-flop FF1 outputs the test address TA[0] as the control signal TAL[0] in response to the input of the clock signal CLK.

Although described later, the control signal TAL[0] is used as a control signal to set selection or non selection of an even-numbered column and an odd-numbered column.

The amplifier AP2 amplifies the control signal TE and outputs the amplified signal as the control signal BIST. In the test mode, the control signal TE is set at the "H" level, and the control signal BIST is set at the "H" level. On the other hand, in the normal mode, the control signal TE is set at the "L" level, and the control signal BIST is set at the "L" level.

The selector SL1 receives the input of the address A[2:0] and the test address TA[3:1], and outputs one of them to the flip-flop FF2 according to the control signal TE.

When the control signal TE is at the "L" level, the selector SL1 outputs the address A[2:0] to the flip-flop FF2. When the control signal TE is at the "H" level, the selector SL1 outputs the test address TA[3:1] to the flip-flop FF2.

The flip-flop FF2 outputs one of the address A[2:0] and the test address TA[3:1] that are inputted, to the predecoder 25 as an address signal ADL[2:0] in response to the input of the clock signal CLK.

The predecoder 25 outputs the row address signal RA[7:0] based on the address signal ADL[2:0] synchronizing with the input of the control signal TDEC.

The selector SL2 receives the input of the control signal WEN and the control signal TWEN, and outputs one of them to the flip-flop FF3 according to the control signal TE.

When the control signal TE is at the "L" level, the selector S12 outputs the control signal WEN to the flip-flop FF3. When the control signal TE is at the "H" level, the selector SL2 outputs the control signal TWEN to the flip-flop FF3.

The flip-flop FF3 outputs one of the control signal WEN and the control signal TWEN that are inputted, as the control signal WENL in response to the input of the clock signal CLK.

The selector SL3 receives the input of the control signal CEN and the control signal TCEN, and outputs one of them to the AND circuit AD1 according to the control signal TE.

When the control signal TE is at the "L" level, the selector SL3 outputs the control signal CEN to the AND circuit AD1. When the control signal TE is at the "H" level, the selector SL3 outputs the control signal TCEN to the AND circuit AD1.

The AND circuit AD1 outputs an AND logical operation result of the signal outputted from the selector SL3 and the clock signal CLK to the AND circuit AD2 as an internal clock CK1.

The output of the AND circuit AD2 is fed to the delay stage DIG. The AND circuit AD2 outputs an AND logical operation result of the input of the internal clock CK1 and an inverted signal of the output of the delay stage DLG, as the control signal TDEC.

The amplifier AP1 amplifies the control signal TDEC and outputs it as the control signal PC. The AND circuit AD3 outputs an AND logical operation result of the control signal TDEC and an inverted signal of the control Signal WENL, as the control signal WTE.

The AND circuit AD4 outputs an AND logical operation result of the control signal TDEC and the control signal WENL as the control signal RDE.

Figure 4:
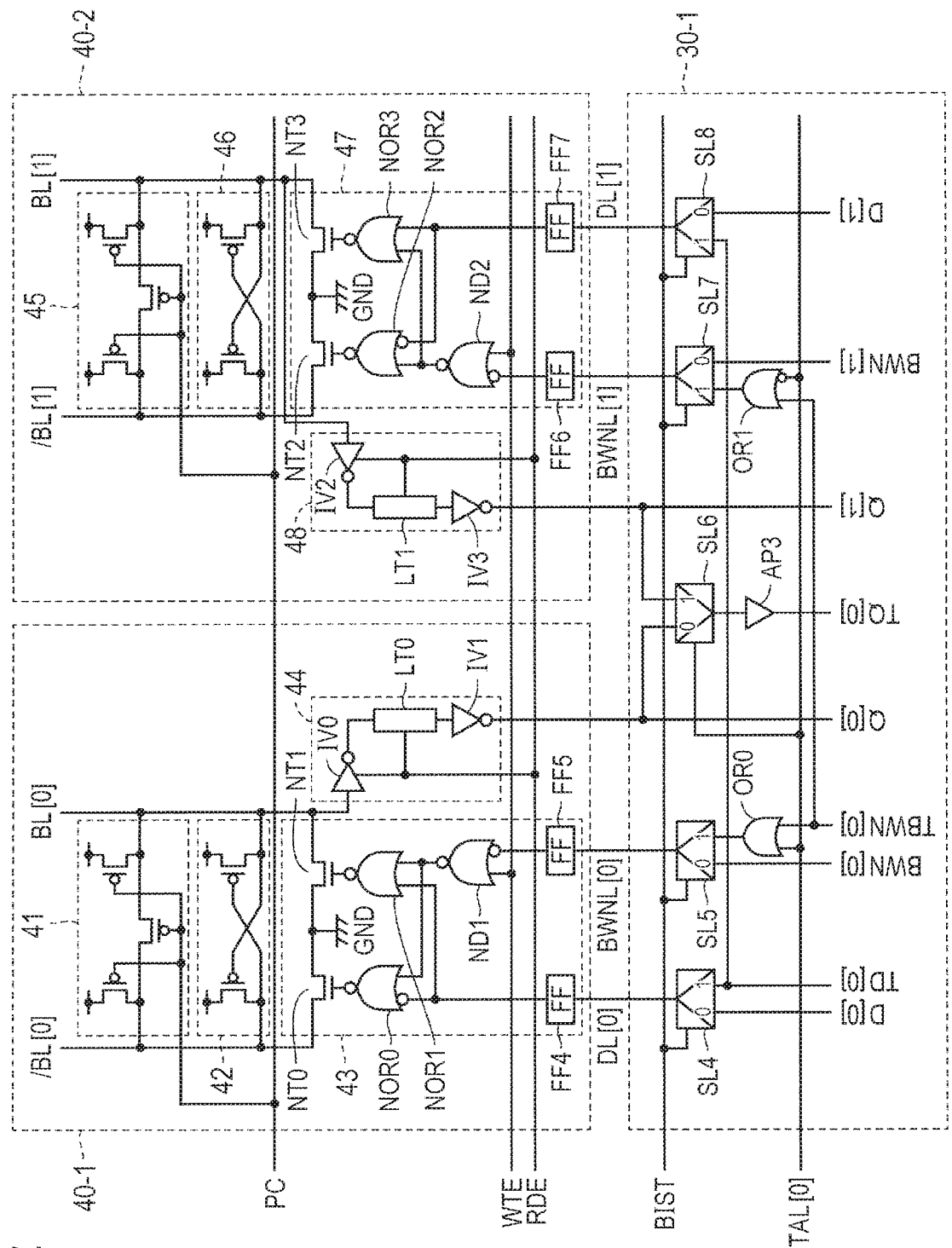
FIG. 4 is a drawing illustrating a circuit diagram of an IC control circuit 40 and an IF control circuit 30 according to Embodiment 1.

FIG. 4 is a drawing illustrating a circuit diagram of the IO control circuit 40 and the IF control circuit 30 according to Embodiment 1.

With reference to FIG. 4, the IO control circuit 40-1 is comprised of a precharge circuit 41, a write assist circuit 42 a write circuit 43, and a read circuit 44.

The precharge circuit 41 is comprised of three P-channel MOS transistors that receive the input of the control signal PC at the gates. In response to the input of the control signal PC ("L" level), the precharge circuit 41 equalizes the bit lines BL and /BL and precharges the bit lines BL and /BL to a power supply voltage VDD.

The write assist circuit 42 is comprised of two P-channel MOS transistors. A first P-channel MOS transistor is provided between the power supply voltage VDD and the bit line BL, and the gate is coupled to the bit line /BL. A second P-channel MOS transistor is provided between the power supply voltage VDD and the bit line /BL, and the gate is coupled to the bit line BL. Therefore, when one of the bit lines BL and /BL, is coupled to a ground voltage GND at the time of data write, a P-channel MOS transistor of which the gate is coupled to the one of the bit lines BL and /BL concerned operates, and the other of the bit lines BL and /BL is pulled up to the power supply voltage VDD.

The write circuit 43 is comprised of two N-channel MOS transistors NT0 and NT1, NOR circuits NR0 and NR1, a NAND circuit ND1, and flip-flops FF4 and FF5.

The Flip-flop FF4 receives and latches the input of data DL[0] from the IF control circuit 30-1 synchronizing with the clock signal CLK (not shown).

The flip-flop FF5 receives and latches the input of mask data BWNL[0] from the IF control circuit 30-1 synchronizing with the clock signal CLK (not shown).

The N-channel MOS transistor NT0 is provided between the bit line /BL and the ground voltage GND and the gate is coupled to an output of the NOR circuit NR0.

The N-channel MOS transistor NT1 is provided between the bit line BL and the ground voltage GND and the gate is coupled to an output of the NOR circuit NR1.

The NOR circuit NR0 outputs a NOR logical operation result of an inverted signal of an output of the flip-flop FF4 and an output of the NAND circuit ND1, to the gate of the N-channel MOS transistor NT0.

The NAND circuit ND1 outputs a NAND logical operation result of an inverted signal of an output of the flip-flop FF5 and an input signal of the control signal WTE, to the NOR circuit NR1.

The NOR circuit NR1 outputs a NOR logical operation result of the output of the NAND circuit ND1 and the output of the flip-flop FF4, to the gate of the N-channel MOS transistor NT1.

When the output of the flip-flop FF5 is set at the "L" level, the write circuit 43 operates according to the control signal WTE ("H" level)

Specifically, one of the N-channel MOS transistors NT0 and NT1 is conducted according to the output of the flip-flop FF4. Specifically, when the output of the flip-flop FF4 is at the "L" level, the N-channel MOS transistor NT1 is conducted. Accordingly, the bit line BL is coupled to the ground voltage GND. Then, the bit line /BL is coupled to the power supply voltage VDD with the aid of the write assist circuit 42.

When the output of the flip-flop FF4 is at the "H" level on the other hand, the N-channel MOS transistor NT0 is conducted. Accordingly, the bit line /BL is coupled to the ground voltage GND. Then, the bit line BL is coupled to the power supply voltage VDD with the aid of the write assist circuit 42.

The read circuit 44 is comprised of inverters IV0 and IV1, and a latch circuit LT0. The inverter IV0 operates in response to the input of the control signal RDE. The inverter IV0 is coupled to the bit line BL[0]. In response to the input of the control signal RDE ("H" level), the inverter IV0 inverts the signal of the bit line BL[0] and outputs it to the latch circuit LT0. The latch circuit LT0 operates in response to the input of the control signal RDE.

The inverter IV1 inverts an output of the latch circuit LT0 and outputs it. Therefore, the bit line BL[0] is coupled to two inverters IV0 and IV1 and the output is fed as read data Q[0] corresponding to the bit line BL[0]. When the bit line BL[0] is at the "L" level at the time of the data read, the read data Q[0] is also set at the "L" level When the bit line BL[0] is at the "H" level, the read data Q[0] is also set at the "H" level.

The IO control circuit 40-2 is comprised of a precharge circuit 45, a write assist circuit 46, a write circuit 47, and a read circuit 48.

The precharge circuit 45 is comprised of three P-channel MOS transistors that receive the input of the control signal PC at the gates. In response to the input of the control signal PC ("L" level), the precharge circuit 41 equalizes the bit lines BL and /BL and precharges the bit lines BL and /BL to the power supply voltage VDD.

The write assist circuit 46 is comprised of two P-channel MOS transistors. A first P-channel MOS transistor is provided between the power supply voltage VDD and the bit line BL, and the gate is coupled to the bit line /BL. A second P-channel MOS transistor is provided between the power supply voltage VDD and the bit line /BL, and the gate is coupled to the bit line BL. Therefore, when one of the bit lines BL and /BL is coupled to a ground voltage GND at the time of data write, a P-channel MOS transistor of which the gate is coupled to the one of the bit lines BL and /BL concerned operates, and the other of the bit lines BL and /BL is pulled up to the power supply voltage VDD.

The write circuit 47 is comprised of two N-channel MOS transistors NT2 and NT3, NOR circuits NR2 and NR3, a NAND circuit ND2, and flip-flops FF6 and FF7.

The Flip-flop FF7 receives and latches the input of data DL[1] from the IF control circuit 30-1 synchronizing with the clock signal CLK (not shown).

The flip-flop FF6 receives and latches the input of mask data BWNL[1] from the IF control circuit 30-1 synchronizing with the clock signal CLK (not shown).

The N-channel MOS transistor NT2 is provided between the bit line /BL and the ground voltage GND and the gate is coupled to an output of the NOR circuit NR2.

The N-channel MOS transistor NT3 is provided between the bit line BL and the ground voltage GND and the gate is coupled to an output of the NOR circuit NR3.

The NOR circuit NR2 outputs a NOR logical operation result of an inverted signal of an output of the flip-flop FF7 and an output of the NAND circuit ND2, to the gate of the N-channel MOS transistor NT2.

The NAND circuit ND2 outputs a NAND logical operation result of an inverted signal of an output of the flip-flop FF6 and an input signal of the control signal WTE, to the NOR circuit NR2.

The NOR circuit NR3 outputs a NOR logical operation result of the output of the NAND circuit ND2 and the output of the flip-flop FF7, to the gate of the N-channel MOS transistor NT3.

When the output of the flip-flop FF6 is set at the "L" level, the write circuit 47 operates according to the control signal WTE ("H" level)

Specifically, one of the N-channel MOS transistors NT2 and NT3 is conducted according to the output of the flip-flop FF7. Specifically, when the output of the flip-flop FF7 is at the "L" level, the N-channel MOS transistor NT3 is conducted. Accordingly, the bit line BL is coupled to the ground voltage GND. Then, the bit line /BL is coupled to the power supply voltage VDD with the aid of the write assist circuit 46

When the output of the flip-flop FF7 is at the "H" level on the other hand, the N-channel MOS transistor NT2 is conducted. Accordingly, the bit line /BL is coupled to the ground voltage GND. Then, the bit line BL is coupled to the power supply voltage VDD with the aid of the write assist circuit 46.

The read circuit 48 is comprised of inverters IV2 and IV3, and a latch circuit LT1. The inverter IV2 operates in response to the input of the control signal RDE. The inverter IV2 is coupled to the bit line BL[1]. In response to the input of the control signal RDE ("H" level), the inverter IV2 inverts the signal of the bit line BL[1] and outputs it to the latch circuit. LT1. The latch circuit LT1 operates in response to the input of the control signal RDE.

The inverter IV3 inverts an output of the latch circuit LT1 and outputs it. Therefore, the bit line BL[1] is coupled to two inverters IV2 and IV3 and the output is fed as read data Q[1] corresponding to the bit line BL[1]. When the bit line BL[1] is at the "L" level at the time of the data read, the read data Q[1] is also set at the "L" level. When the bit line BL[1] is at the "H" level, the read data Q[1] is also set at the "H" level.

Next, the IF control circuit 30-1 is explained. The IF control circuit 30-1 is comprised of selectors SL4-SL8, OR circuits OR0 and OR1, and an amplifier AP3.

The selector SL4 outputs one of the data D[0] and the test data TD[0] that are inputted, to the IO control circuit 40-1 as the data DL[0] according to the input of the control signal BIST.

Specifically, the selector SL4 outputs the data D[0] that is inputted, to the IO control circuit 40-1 as the data DL[0] according to the input of the control signal BIST ("L" level). On the other hand, the selector SL4 outputs the test data TD[0] that is inputted, to the IO control circuit 40-1 as the data DL[0] according to the input of the control signal BIST ("H" level).

The OR circuit OR0 outputs an OR logical operation result of the control signal TAL[0] and the mask data TBWN[0] to the selector SL5.

The mask data is the flag data to prohibit the writing of the bit concerned. Specifically, when the mask data BWN and TBWN are at the "H" level, the writing of the bit concerned is prohibited.

The mask data BWN is used for the normal mode. The mask data TBWN is used for the test mode.

The selector SL5 outputs one of the mask data BWN[0] and an output of the OR circuit OR0 that are inputted, to the IO control circuit 40-1 as the mask data BWNL[0] according to the input of the control signal BIST.

Specifically, the selector SL5 outputs the mask data BWN[0] that is inputted, to the IO control circuit 40-1 as the mask data BWNL[0] according to the input of the control signal BIST ("L" level). On the other hand, the selector SL5 outputs the output of the OR circuit OR0 that is inputted, to the IO control circuit 40-1 as the mask data BWNL[0] according to the input of the control signal BIST ("H" level).

The selector SL8 outputs one of the data D[1] and the test data TD[0] that are inputted, to the IO control circuit 40-2 as the data DL[1] according to the input of the control signal BIST.

Specifically, the selector SL8 outputs the data D[1] that is inputted, to the IO control circuit 40-2 as the data DL[1] according to the input of the control signal BIST ("L" level). On the other hand, the selector SL8 outputs the test data TD[0] that is inputted, to the IO control circuit 40-2 as the data DL[1] according to the input of the control signal BIST ("H" level).

The OR circuit OR1 outputs an OR logical operation result of an inverted signal of the control signal TAL[0] and the mask data TBWN[0] to the selector SL7.

The selector SL7 outputs one of the mask data BWN[1] and the output of the OR circuit OR1 that are inputted, to the IO control circuit 40-2 as the mask data BWNL[1] according to the input of the control signal BIST.

Specifically, the selector SL7 outputs the mask data BWN[1] that is inputted, to the IO control circuit 40-2 as the mask data BWNL[1] according to the input of the control signal BIST ("L" level). On the other hand, the selector SL7 outputs the output of the OR circuit OR1 that is inputted, to the IO control circuit 40-2 as the mask data BWNL[1] according to the input of the control signal BIST ("H" level).

The selector SL6 outputs one of the read data Q[0] and the read data Q[1] that are inputted, to the amplifier AP3 according to the input of the control signal TAL[0]. The amplifier AP3 amplifies the inputted signal and outputs it to the BIST circuit 4 as the read data TQ[0].

Specifically, the selector SL6 outputs the read data Q[0] to the amplifier AP3 according to the input of the control signal TAL[0] ("L" level). On the other hand, the selector SL6 outputs the read data Q[1] to the amplifier AP3 according to the input of the control signal TAL[0] ("H" level).

In the normal mode, the control signal BIST is set at the "L" level. Therefore, the selector SL4 outputs the data D[0] to the flip-flop FF4 as the data DL[0]. The selector SL5 outputs the mask data BWN[0] to the flip-flop FF5 as the mask data BWNL[0].

The selector SL8 outputs the data D[1] to the flip-flop FF7 as the data DL[1]. The selector SL7 outputs the mask data BWN[1] to the flip-flop FF6 as the mask data BWNL[1].

In the test mode, the control signal BIST is set at the "H" level. Therefore, the selector SL4 outputs the test data TD[0] to the flip-flop FF4 as the data DL[0]. The selector SL5 outputs the output of the OR circuit OR0 to the flip-flop FF5 as the mask data BWNL[0].

The selector SL8 outputs the test data TD[1] to the flip-flop FF7 as the data DL[1]. The selector SL7 outputs the output of the OR circuit OR1 to the flip-flop FF6 as the mask data BWNL[1].

(1) The Data Write in the Normal Mode

The data write to the memory cell MC00 is explained.

As an example, it is assumed that the data D[0] is set at the "H" level and the mask data BWN[0] is set at the "L" level. The control signal BIST is at the "L" level.

In this case, the IF control circuit 30-1 outputs the data DL[0] ("H" level) to the flip-flop FF4 and outputs the mask data BWNL[0] ("L" level) to the flip-flop FF5.

The flip-flops FF4 and FF5 latch the data synchronizing with the clock signal CLK (not shown).

The IO control circuit 40-1 operates the write circuit 43 according to the control signal WTE ("H" level).

In the present example, the output of the flip-flop FF4 is set at the "H" level to conduct the N-channel MOS transistor NT0. Accordingly, the bit line /BL is coupled to the ground voltage GND, and the bit line BL is coupled to the power supply voltage VDD with the aid of the write assist circuit 42.

When the word line WL[0] is selected, the memory node MB of the memory cell MC00 is set at the "L" level and the memory node MT is set at the "H" level to store data "1."

When the data D[0] is at the "L" level, the memory node MB of the memory cell MC00 is set at the "H" level and the memory node MT is set at the "L" level to store data "0."

The case where the mask data BWN[0] is set at the "H" level is explained. In this case, the mask data BWNL[0] ("H" level) is outputted to the flip-flop FF5. Accordingly, the output of the NAND circuit ND1 is set at the "H" level and the output of the NOR circuits NR0 and NR1 is also set at the "H" level. Therefore, the N-channel MOS transistors NT0 and NT1 are not conducted and the writing is prohibited.

The above explanation is made for the data D[0] and the same applies for the data D[1].

(2) The Data Read in the Normal Mode

The memory 3 according to Embodiment 1 selects one of the eight word lines WL[0]-WL[7] in response to the input of the address A[2:0] as an example.

Specifically, based on the input of the address A[2:0], the row selection of the memory cell array 6 is performed, however, the column selection is not performed. The memory 3 according to Embodiment 1 is a memory array (MUX1) in which only a row address is assigned as the address and a column address is not assigned. In other words, it is a memory of one CPB (Column Per Bit).

Therefore, the data of the memory cell MC of the selected memory cell row are collectively read.

When the word line WL[0] is selected by the address A[2:0] as an example, the data of the memory cells MC00, MC01, and . . . corresponding to the word line WL[0] is read.

In this case, the control signal RDE is set at the "H" level. Accordingly, the read circuit provided for each column operates. As an example, in the read circuit 44, according to the control signal RDE ("H" level), the inverter IV0 inverts the signal of the bit line BL[0] and outputs it to the latch circuit LT0. The latch circuit LT0 latches the output signal of the inverter IV0 and outputs it to the inverter IV1. The inverter IV1 inverts the signal from the latch circuit LT0 and outputs it as the read data Q[0]. The latch circuit LT0 operates in response to the input of the control signal RDE.

The same applies to the other read circuits. Accordingly, the read data Q[0], Q[1], and . . . of the multiple bits are collectively read.

(3) The Data Write in the Test Mode

The data write to the memory cell MC00 is explained.

As an example, it is assumed that the test data TD[0] is set at the "L" level and the mask data TBWN[0] is set at the "L" level. The control signal BIST is at the "H" level.

In this case, the IF control circuit 30-1 outputs the data DL[0] ("L" level) to the flip-flop FF4 and outputs the mask data. BWNL[0] ("L" level) to the flip-flop FF5.

The flip-flops FF4 and FF5 latch data synchronizing with the clock signal CLK (not shown).

The IO control circuit 40-1 operates the write circuit 43 according to the control signal WTE ("H" level).

In the present example, the output of the flip-flop FF4 is set at the "L" level to conduct the N-channel MOS transistor NT1. Accordingly, the bit line BL is coupled to the ground voltage GND, and the bit line /BL is coupled to the power supply voltage VDD with the aid of the write assist circuit 42.

When the word line WL[0] is selected, the memory node MB of the memory cell MC00 is set at the "H" level and the memory node MT is set at the "L" level to store data "0."

When the test data TD[0] is at the "H" level, the memory node MB of the memory cell MC00 is set at the "L" level and the memory node MT is set at the "H" level to store data "1."

The case where the mask data TBWN[0] is set at the "H" level is explained. In this case, the mask data BWNL[0] ("H" level) is outputted to the flip-flop FF5. Accordingly, the output of the NAND circuit ND1 is set at the "H" level and the output of the NOR circuits NR0 and NR1 is also set at the "H" level. Therefore, the N-channel MOS transistors NT0 and NT1 are not conducted and the writing is prohibited.

In the present example, in the test mode, it is possible to prohibit the writing to a bit according to the control signal TAL[0] in addition to the mask data TBWN.

In the present example, when executing the so-called marching test, the logical level of control signal TAL[0] is switched.

As an example, when the control signal TAL[0] is at the "H" level, the OR circuit OR0 outputs the "H" level to the selector SL5. The OR circuit OR1 outputs the "L" level to the selector SL7.

When the control signal BIST is at the "H" level, the selector SL5 outputs the mask data BWNL[0] ("H" level) to the flip-flop FF5. The selector SL7 outputs the mask data BWNL[1] ("L" level) to the flip-flop FF6.

Accordingly, the writing of the even-numbered memory cell column is prohibited. For example, the writing of the 0th, 2nd, 4th, and (2n)th memory cell columns is prohibited.

On the other hand, when the control signal TAL[0] is at the "L" level, the OR circuit OR0 outputs the "L" level to the selector SL5. The OR circuit OR1 outputs the "H" level to the selector SL7.

When the control signal BIST is at the "H" level, the selector SL5 outputs the mask data BWNL[0] ("L" level) to the flip-flop FF5. The selector SL7 outputs the mask data BWNL[1] ("H" level) to the flip-flop FF6.

Accordingly, the writing of the odd-numbered memory cell column is prohibited. For example, the writing of the 1st, 3rd, 5th . . . memory cell columns is prohibited.

The control signal TAL[0] is set up according to the test address TA[0]. Therefore, when the test address TA[3:0] is incremented, the logical level of the test address TA[0] is changed and the logical level of the control signal TAL[0] is changed.

That is, according to the increment of the test address TA[3:0], the writing of the even-numbered memory cell column and the writing of the odd-numbered memory cell column are alternately prohibited. Therefore, in the test mode, the writing to the adjoining memory cell column is prohibited.

Therefore, in the test mode in the present exmple, the writing is performed only to one of two memory cell columns. Therefore, the present exmple has the configuration in which the test data TD[0] is used in common for two memory cell columns.

According to the configuration concerned, the number of terminal to which the test data is inputted can be set as half that of the normal data.

(4) The Data Read in the Test Mode

In the memory 3 according to Embodiment 1, one of the eight word lines WL[0]-WL[7] is selected in response to the input of the test address TA[3:0] as an example.

Specifically, the address TA[0] is used as a flag to prohibit the writing of a memory cell column as described above.

The test address TA[3:1] is assigned to the same address space as the address A[2:0].

The control circuit 20 generates a row address signal RA[7:0] according to the input of the test address TA[3:1] and performs the row selection of the memory cell array 6.

Therefore, the data of the memory cell MC of the selected memory cell row are collectively read.

As an example, when the word line WL[0] is selected according to the test address TA[3:1], the data of the memory cells MC00, MC01, and . . . corresponding to the word line WL[0] is read.

In this case, the control signal RDE is set at the "H" level. Accordingly, the read circuit provided for each column operates. As an example, in the read circuit 44, according to the control signal RDE ("H" level), the inverter IV0 inverts the signal of the bit line BL[0] and outputs it to the latch circuit LT0. The latch circuit LT0 latches the output signal of the inverter IV0 and outputs it to the inverter IV1. The inverter IV1 inverts the signal from the latch circuit LT0 and outputs it as the read data Q[0]. The same applies to the other read circuits.

Accordingly, the read data Q[0], Q[1], and . . . of the multiple bits are collectively read.

In the test mode according to the present exmple, the read data Q[0], Q[1], and . . . of the multiple hits are collectively read, and the data of a part of the multiple bits is outputted to the BIST circuit 4 as the read data TQ.

Specifically, the selector SL6 selects and outputs one of the read data Q[0] and Q[1] in response to the input of the control signal TAL[0]. Specifically, when the control signal TAL[0] is at the "L" level, the read data Q[0] is selected. On the other hand, when the control signal TAL[0] is at the "H" level, the read data Q[1] is selected. The selected read data Q is amplified by the amplifier AP3 and is outputted as the read data TQ.

Therefore, the data of half the read data Q[0], Q[1], and . . . of the multiple bits is collectively read. Specifically, the even-numbered read data Q[0], Q[2], and . . . or the odd-numbered read data Q[1], Q[3], and . . . are outputted to the BIST circuit 4 as the read data TQ.

According to the configuration concerned, it is possible to set the number of the terminal to which the read data is outputted in the test mode as half that of the normal data.

In response to the read data in the test mode, the BIST circuit 4 performs data analysis and the predetermined test determination processing.

Figure 5:
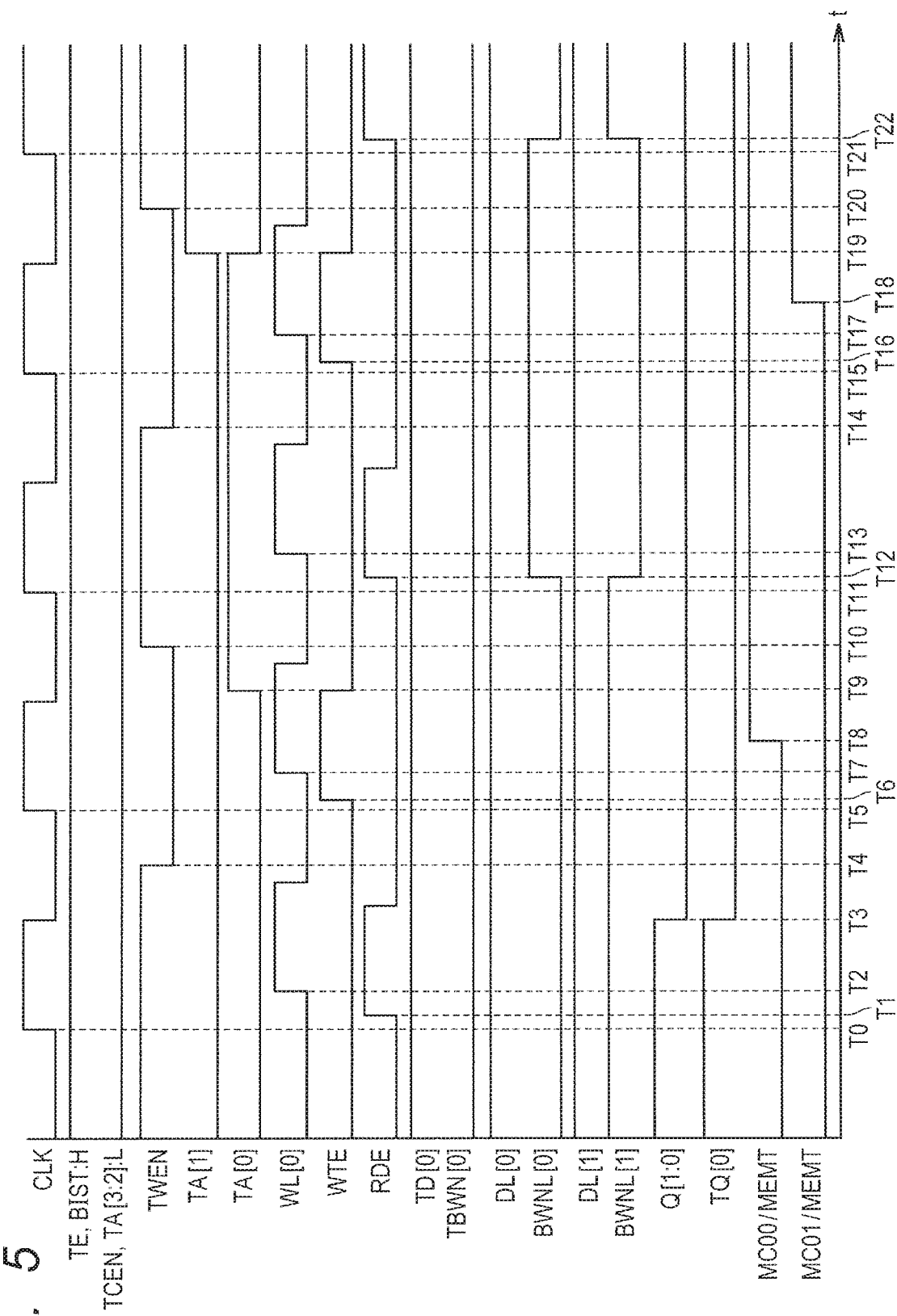
FIG. 5 is a timing chart illustrating operation in a test mode of the memory 3 according to Embodiment 1.

FIG. 5 is a timing chart illustrating operation in the test mode of the memory 3 according to Embodiment 1.

The present embodiment explains the marching test in which the data read and the data write are alternately performed.

The control signal TE is set at the "H" level. Therefore, the control signal BIST is set at the "H" level.

As illustrated in FIG. 5, the data read (read cycle) is first explained as an example.

The memory 3 operates synchronizing with the clock signal CLK. In the present exmple, the clock signal CLK rises at Time T0 as an example.

Synchronizing with the clock signal CLK, the control circuit 20 fetches the test address TA and the control signal, and outputs various kinds of control signals.

As an example, the test address TA[0] is set at the "L" level. Accordingly, the control signal TAL[0] is set at the "L" level.

Since the control signal TWEN is at the "H" level, the control signal RDE is set at the "H" level at Time T1. Accordingly, the data read is performed. Next, at Time T2, the word line WL[0] is selected ("H" level). Accordingly, the data read of the memory cells MC00, MC01, and . . . corresponding to the word line WL[0] is performed.

Since the control signal TAL[0] is at the "L" level, the even-numbered memory cell column is selected. As an example, the selector SL6 selects the read data Q[0] and outputs it as the read data TQ[0].

The present example shows a case where at Time T3, the read data Q and TQ are outputted. Next, at Time T4, the control signal TWEN is set at the "L" level.

Next, at Time T5, synchronizing with the clock signal CLK, the control circuit 20 fetches the test address TA and the control signal, and outputs various kinds of control signals.

Since the control signal TWEN is at the "L" level, the control signal WTE is set at the "H" level at Time T6. Accordingly, the data write is performed.

Next, at Time T7, the word line WL[0] is selected ("H" level). The test address TA[0] is set at the "L" level. Accordingly, the data write to the memory cell MC of the even-numbered memory cell column is performed. The data write to the memory cell MC of the odd-numbered memory cell column is prohibited.

Specifically, the data write of the memory cells MC00, MC02, . . . , corresponding to the word line WL[0] is performed. On the other hand, the data write of the memory cells MC01, MC03, and . . . is prohibited.

The present example shows a case where at Time T8, the data write to the memory cell MC00 is performed.

Next, the present example shows a case where at Time T9, the test address TA is incremented and the test address TA[0] is set at the "H" level. Accordingly, the control signal TAL[0] is set at the "H" level.

Next, at Time T10, the control signal TWEN is set at the "H" level. At Time T11, synchronizing with the clock signal CLK, the control circuit 20 fetches the test address TA and the control signal, and outputs various kinds of control signals.

Since the control signal TWEN is at the "H" level, the control signal RDE is set at the "H" level at Time T12. Accordingly, the data read is performed.

Next, at Time T13, the word line WL[0] is selected ("H" level). Accordingly, the data read of the memory cells MC00, MC01, and . . . corresponding to the word line WL[0] is performed.

Since the control signal TAL[0] is at the "L" level, the even-numbered memory cell column is selected. As an example, the selector SL6 selects the read data Q[1] and outputs it as the read data TQ[0].

Next, at Time T14, the control signal TWEN is set at the "L" level. Next, at Time T15, synchronizing with the clock signal CLK, the control circuit 20 fetches the test address TA and the control signal, and outputs various kinds of control signals.

Since the control signal TWEN is at the "L" level, the control signal WTE is set at the "H" level at Time T16. Accordingly, the data write is performed.

Next, at Time T17, the word line WL[0] is selected ("H" level). The test address TA[0] is set at the "H" level. Therefore, the data write to the memory cell MC of the odd-numbered memory cell column is performed. The data write to the memory cell MC of the even-numbered memory cell column is prohibited.

Specifically, the data write of the memory cells MC01, MC03, . . . , corresponding to the word line WL[0] is performed. On the other hand, the data write of the memory cells MC00, MCO2, and . . . is prohibited.

The present example shows a case where at Time T18, the data write to the memory cell MC01 is performed.

Next, the present example shows a case where at Time T19, the test address TA is incremented, and the test address TA[0] is set at the "L" level and the test address TA[1] is set at the "H" level. Accordingly, the control signal TAL[0] is set at the "L" level.

Next, at Time T20, the control signal TWEN is set at the "H" level. At time T21, synchronizing with the clock signal CLK, the control circuit 20 fetches the test address TA and the control signal, and outputs various kinds of control signals.

Since the control signal TWEN is at the "H" level, the control signal RDE is set at the "H" level at Time T22. Accordingly, the data read is performed.

Next, as an example, the word line WL[1] is selected ("H" level). Accordingly, the data read of the memory cells MC10, MC11, and . . . corresponding to the word line WL[1] is performed.

Since the control signal TAL[0] is at the "L" level, the even-numbered memory cell column is selected. As an example, the selector SL6 selects the read data Q[0] and outputs it as the read data TQ[0].

FIG. 6A and FIG. 6B are conceptual diagrams illustrating the marching test according to Embodiment 1. FIG. 6A illustrates the marching test of the memory (MUX1) as a comparative example.

As explained above, in the memory (MUX1), only a row address is assigned as the address and a column address is not assigned.

Therefore, in the memory concerned, all the memory cell columns in the row direction become in the selected state by the assignment of the address, and it is difficult to set only the adjoining memory cell as in the un-selected state.

Therefore, it is difficult to detect the data garbling of the memory cell MC of the adjoining column due to the data write.

FIG. 6B illustrates the marching test of the memory (MUX1) according to the present application. As explained above, in the memory (MUX1) according to the comparative example, only a row address is assigned as the address and a column address is not assigned.

On the other hand, the memory (MUX1) according to the present application can select the even-numbered memory cell column and the odd-numbered memory cell column respectively, by use of the test address TA[0].

Therefore, by verifying the data read and the data write that are performed to the even-numbered memory cell column and the odd-numbered memory cell column alternately, it is possible to perform the marching test to detect the failure of the adjacent cell.

(A Modified Example of Embodiment 1)

Figure 7:
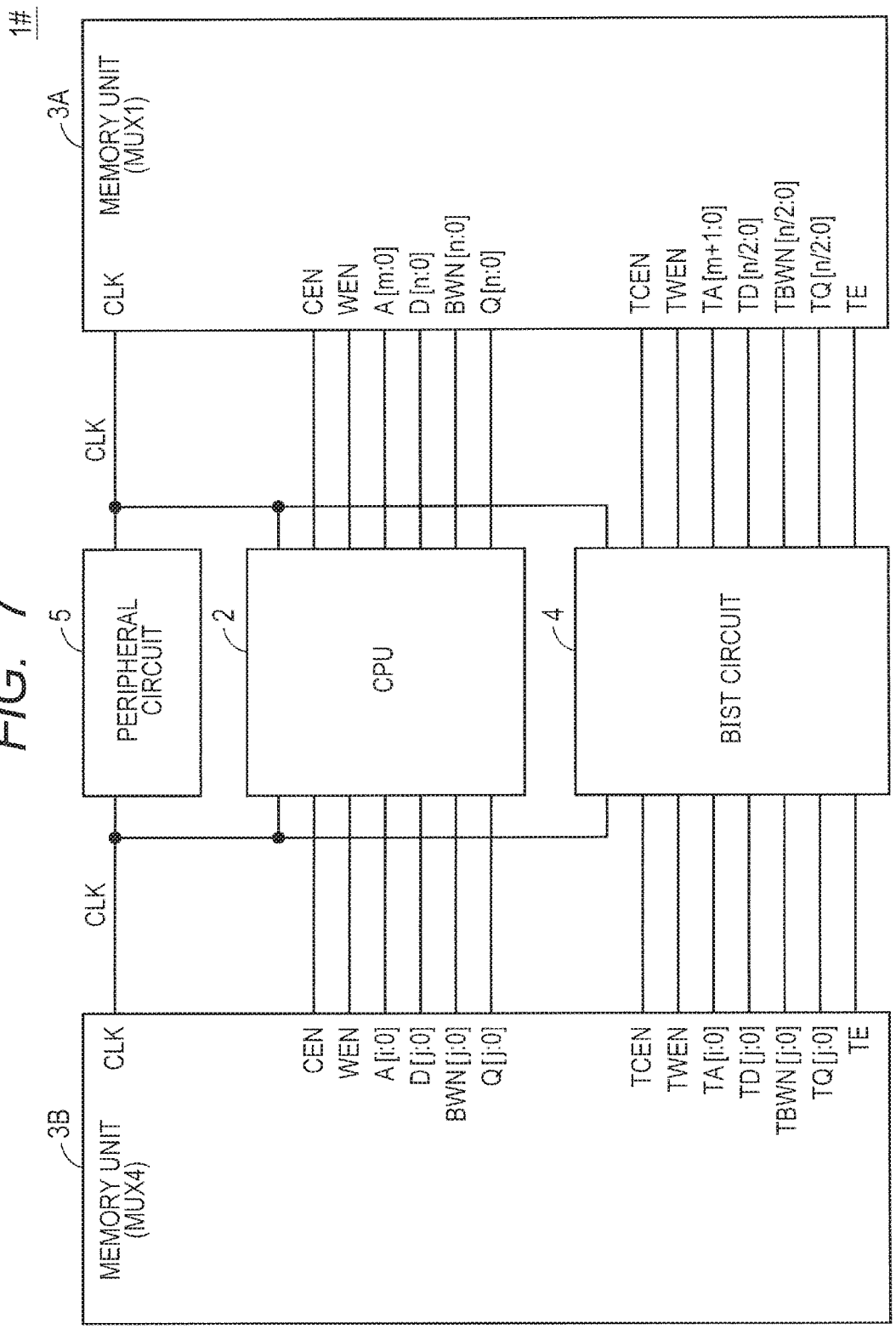
FIG. 7 is an appearance diagram illustrating a configuration of a semiconductor chip 1# according to a modified example of Embodiment 1.

FIG. 7 is an appearance diagram illustrating a configuration of a semiconductor chip 1# according to a modified example of Embodiment 1.

With reference to FIG. 7, the semiconductor chip 1# is different from the semiconductor chip 1 illustrated in FIG. 1 in that the memory 3 is replaced with memory units 3A and 3B.

As is the case with the memory 3, the memory unit 3A includes a memory array (MUX1) in which only a row address is assigned as the address and a column address is not assigned. In other words, it is a memory of one CPB (Column Per Bit).

The memory unit 3B includes a memory array (MUX4) that has a row address and a column address as the address. In other words, it is a memory of four CPBs.

The configuration of the memory unit 3A is fundamentally same as that of the memory 3. Therefore, the detailed explanation thereof is not repeated.

Figure 8:
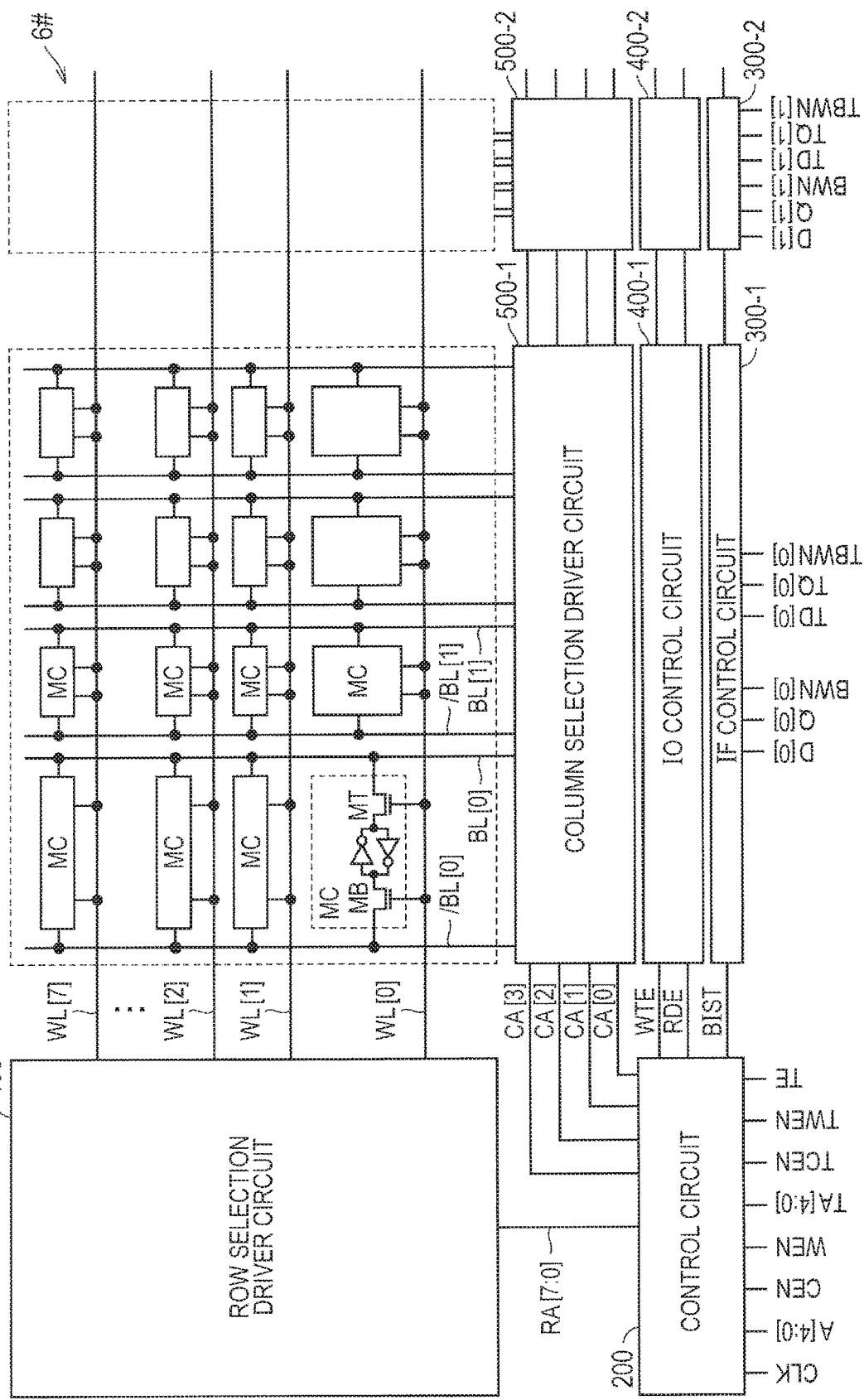
FIG. 8 is a drawing illustrating a configuration of a memory unit 3B according to the modified example of Embodiment 1.

FIG. 8 is a drawing illustrating a configuration of the memory unit 3B according to the modified example of Embodiment 1. With reference to FIG. 8, the memory unit 3B is comprised of a memory cell array 6# with memory cells MC arranged in a matrix, a row selection driver circuit 100, a control circuit 200 to control the whole memory unit 3B, multiple column selection driver circuits 500, multiple IO (input-output) control circuits 400, and multiple IF (interface) control circuits 300.

The memory cell array 6# includes multiple memory cells MC arranged in a matrix. Each memory cell MC is an SRAM (Static Random Access Memory) cell that is rewritable.

Multiple word lines WL are provided for each memory cell row. The present example shows a case where eight word lines WL[0]-WL[7] are provided.

Multiple bit-line pairs BLP are provided for each memory cell column. The present example shows a case where bit-line pairs BLP[0], BLP[1], and . . . are provided. The bit-line pair BLP includes bit lines BL and /BL.

The control circuit 200 controls the whole memory unit 3B. The control circuit 200 executes a predetermined operation in response to the input of a clock signal CLK, an address A[4:0], a control signal CEN, a control signal WEN, a test address TA[4:0], a control signal TCEN, a control signal TWEN, and a control signal TE.

Specifically, the control circuit 200 outputs a row address signal RA[7:0] to the row selection driver circuit 100. The row selection driver circuit 100 selects a word line WL according to the row address signal RA[7:0]. In the present example, the row selection driver circuit 100 selects one of the word lines WL.

Based on the input signals, the control circuit 200 outputs column address signals CA[0]-CA[3], a control signal PC, a control signal RDE, a control signal WTE, and a control signal BIST if needed.

The column selection driver circuit 500 is provided for each of four memory cell columns. The present example shows a case where the column selection driver circuits 500-1, 500-2, and . . . are provided. The column selection driver circuit 500 selects one memory cell column according to the column address signals CA[0]-CA[3].

The IO control circuit 400 and the IF control circuit 300 are provided corresponding to each of the multiple column selection driver circuits 500.

The present example shows a case where IO control circuits 400-1, 400-2, and . . . are provided.

The present example also shows a case where IF control circuits 300-1, 300-2, and . . . are provided.

Figure 9:
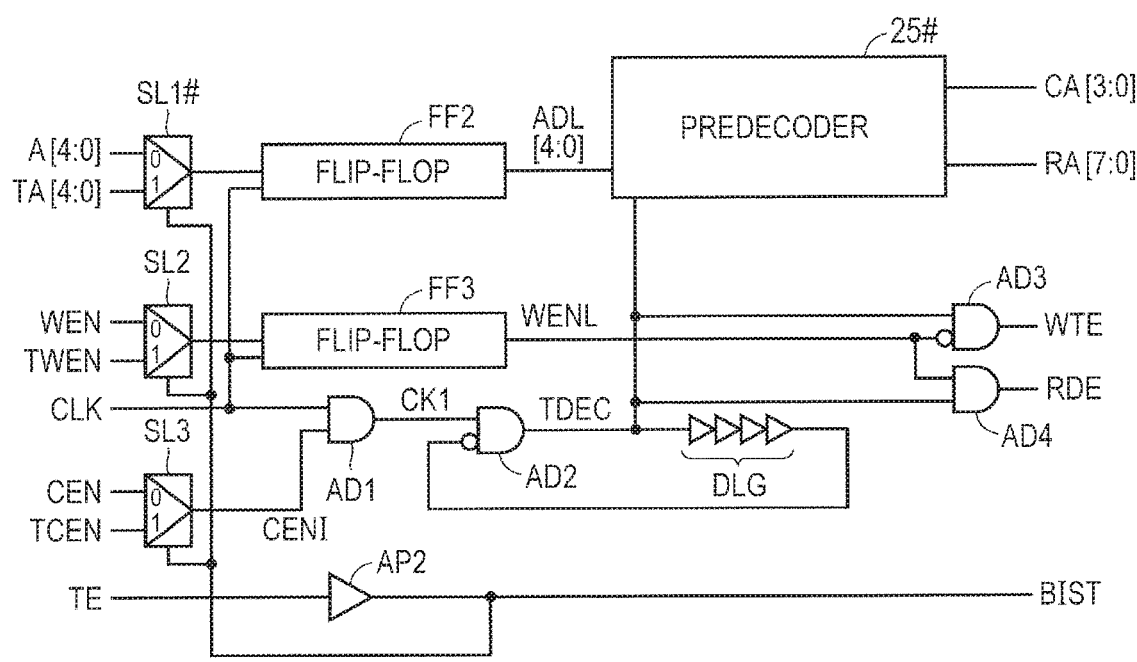
FIG. 9 is a drawing illustrating a circuit diagram of a control circuit 200 according to the modified example of Embodiment 1.

FIG. 9 is a drawing illustrating a circuit diagram of the control circuit 200 according to the modified example of Embodiment 1. With reference to FIG. 9, the control circuit 200 is different from the control circuit 20 in that the flip-flop FF1 is deleted, that the amplifier AP1 is deleted, that the selector SL1 is replaced with a selector SL1#, and that the predecoder 25 is replaced with a predecoder 25#. The configuration of the other elements is the same. Therefore, the detailed explanation thereof is not repeated.

The selector SL1# receives the input of the address A[4:0] and the test address TA[4:0], and outputs one of them to the flip-flop FF2 according to the control signal TE.

When the control signal TE is at the "L" level, the selector SL1# outputs the address A[4:0] to the flip-flop FF2.

When the control signal TE is at the "H" level, the selector SL1# outputs the test address TA[4:0] to the flip-flop FF2.

The flip-flop FF2 outputs one of the address A[4:0] and TA[4:0] that are inputted, to the predecoder 25# as an address signal ADL[4:0] in response to the input of the clock signal CLK.

The predecoder 25# outputs a row address signal RA[7:0] and a column address signal CA[3:0] based on the address signal ADL[4:0] synchronizing with the input of the control signal TDEC.

Figure 10:
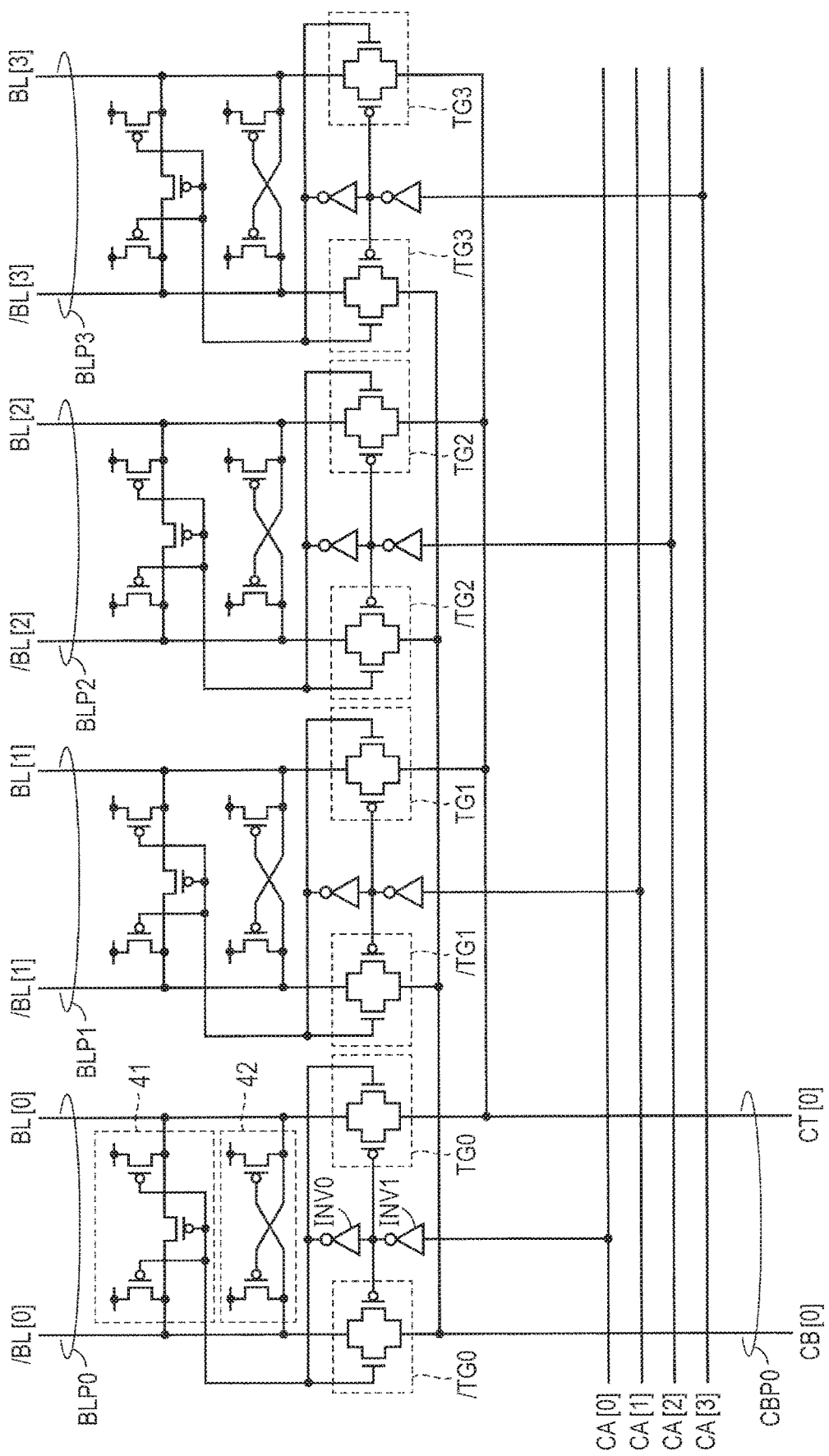
FIG. 10 is a drawing illustrating a circuit diagram of a column selection driver circuit 500 according to the modified example of Embodiment 1.

FIG. 10 is a drawing illustrating a circuit diagram of the column selection driver circuit 500 according to the modified example of Embodiment 1. With reference to FIG. 10, the row selection driver circuit 500 is comprised of multiple precharge circuits 41 and multiple write assist circuits 42 that are provided corresponding to each column.

The precharge circuit 41 is comprised of three P-channel MOS transistors that receive the input of the control signal PC at the gate. In response to the input of the column address signal CA ("L" level), the precharge circuit 41 equalizes the bit lines BL and /BL, and precharges the bit lines BL and /BL to the power supply voltage VDD.

The write assist circuit 42 is comprised of two P-channel MOS transistors. A first P-channel MOS transistor is provided between the power supply voltage VDD and the bit line BL, and the gate is coupled to the bit line /BL. A second P-channel MOS transistor is provided between the power supply voltage and the bit line /BL, and the gate is coupled to the bit line BL. Therefore, when one of the bit lines BL and /BL is coupled to a ground voltage GND at the time of data write, a P-channel MOS transistor of which the gate is coupled to the one of the bit lines BL and /BL concerned operates, and the other of the bit lines Bit and /BL is pulled up to the power supply voltage VDD.

The present example shows a case where one data-line pair CBP is provided corresponding to each bit-line pair BLP of the four memory cell columns. The present example shows a case where the data-line pair CBP0 is provided corresponding to the bit-line pairs BLP0-BLP3.

The data-line pair CBP0 is comprised of the data lines CB[0] and CT[0]. A transfer gate TG is provided between the data-line pair CBP0 and each bit-line pair BLP. Inverters INV0 and INV1 are provided to drive a transfer gate TG.

Specifically, the present example shows a case where the transfer gates /TG0, /TG1, /TG2, and /TG3 are provided between the data line CB[0] and the bit lines /BL[0], /BL[1], /BL[2], and /BL[3], respectively.

The transfer gates TG0, TG1, TG2, and TG3 are provided between the data line CT[0] and the bit lines BL[0], BL[1], BL[2], BL[3], respectively.

The inverter INV1 inverts the column address signal CA[0] and outputs it to a gate of a P-channel MOS transistor of the transfer gates TG0 and /TG0. The inverter INV0 inverts the output of the inverter INV1 and outputs it to a gate of an N-channel MOS transistor of the transfer gates TG0 and /TG0.

The same applies to the configuration of other transfer gates TG. When the column address signal CA[0] is at the "H" level as an example, the transfer gates TG0 and /TG0 are conducted, and the bit-line pair BLP0 and the data-line pair CBP0 are electrically coupled.

Similarly, when the column address signal CA[1] is at the "H" level, the transfer gates TG1 and /TG1 are conducted, and the bit-line pair BLP1 and the data-line pair CBP0 are electrically coupled. When the column address signal CA[2] is at the "H" level, the transfer gates TG2 and /TG2 are conducted, and the bit-line pair BLP2 and the data-line pair CBP0 are electrically coupled. When the column address signal CA[3] is at the "H" level, the transfer gates TG3 and /TG3 are conducted, and the hit-line pair BLP3 and the data-line pair CBP0 are electrically coupled.

Accordingly, it is possible to select a memory cell column according to the column address signal. The precharge circuit 41 is operated using the column address signal CA ("L" level). Accordingly, it is not necessary to generate the control signal PC, leading to the reduction of the wiring number.

Figure 11:
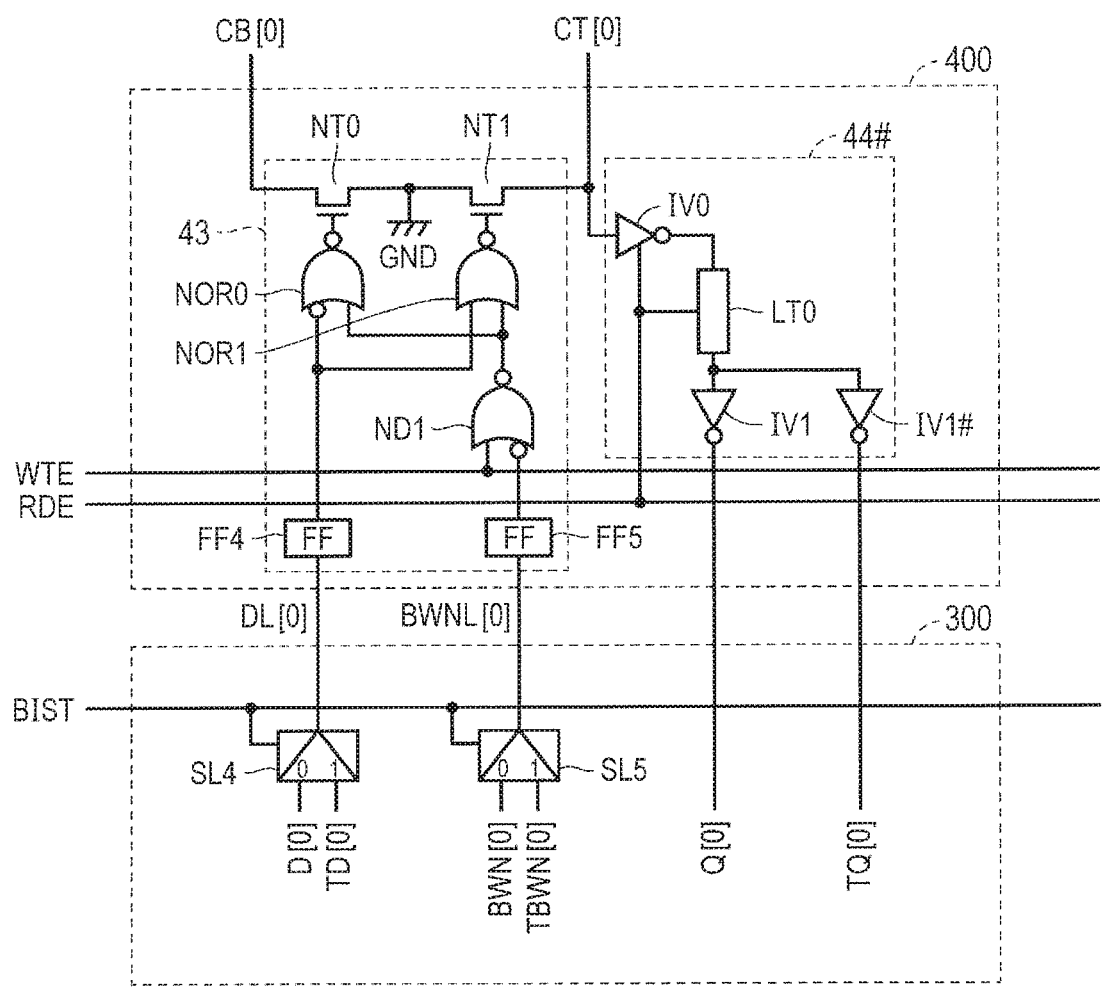
FIG. 11 is a drawing illustrating a circuit diagram of an IO control circuit 400 and an IF control circuit 300 according to the modified example of Embodiment 1.

FIG. 11 is a drawing illustrating a circuit diagram of the IO control circuit 400 and the IF control circuit 300 according to the modified example of Embodiment 1.

With reference to FIG. 11, the IO control circuit 400 is different from the IO control circuit 40 illustrated in FIG. 4 in that the precharge circuit 41 and the write assist circuit 42 are deleted and that the read circuit 44 is replaced with the read circuit 44#.

The other configurations are the same as in FIG. 4. Therefore, the detailed explanation thereof is not repeated.

The read circuit 44# is different from the read circuit 44 in that an inverter IV1# is added. The other configurations are the same as in FIG. 4. Therefore, the detailed explanation thereof is not repeated.

The inverter INV1# inverts the output of the latch circuit LT0 and outputs it as the read data TQ[0].

The IF control circuit 300 is provided corresponding to the IO control circuit 400. The IF control circuit 300 is comprised of selectors SL4 and SL5.

The selector SL4 outputs one of the data D[0] and the test data TD[0] that are inputted, to the IO control circuit 400 as the data DL[0] according to the input of the control signal BIST.

Specifically, the selector SL4 outputs the data D[0] that is inputted, to the IO control circuit 400 as the data DL[0] according to the input of the control signal BIST ("L" level). On the other hand, the selector SL4 outputs the test data TD[0] that is inputted, to the IO control circuit 400 as the data DL[0] according to the input of the control signal BIST ("H" level).

The selector SL5 outputs one of the mask data BWN[0] and the mask data TBWN[0] that are inputted, to the IO control circuit 400 as the mask data BWNL[0] according to the input of the control signal BIST.

Specifically, the selector SL5 outputs the mask data BWN[0] that is inputted, to the IO control circuit 400 as the mask data BWNL[0] according to the input of the control signal BIST ("L" level). On the other hand, the selector SL5 outputs the mask data TBWN[0] that is inputted, to the IO control circuit 400 as the mask data BWNL[0] according to the input of the control signal BIST ("H" level).

In the normal mode, the control signal BIST is set at the "L" level. Therefore, the selector SL4 outputs the data D[0] to the flip-flop FF4 as the data DL[0], and the selector SL5 outputs the mask data BWN[0] to the flip-flop FF5 as the mask data BWNL[0].

In the test mode, the control signal BIST is set at the "H" level. Therefore, the selector SL4 outputs the test data TD[0] to the flip-flop FF4 as the data DL[0], and the selector SL5 outputs the mask data TBWN[0] to the flip-flop FF5 as the mask data BWNL[0].

(5) The Data Write in the Normal Mode

The data write to the memory cell MC00 is explained.

As an example, it is assumed that the data D[0] is set at the "H" level and the mask data BWN[0] is set at the "L" level. The control signal BIST is at the "L" level.

In this case, the IF control circuit 300 outputs the data DL[0] ("H" level) to the flip-flop FF4 and outputs the mask data BWNL[0] ("L" level) to the flip-flop FF5.

The flip-flops FF4 and FF5 latch data synchronizing with the clock signal CLK (not shown).

The IO control circuit 400 operates the write circuit 43 according to the control signal WTE ("H" level).

In the present example, the output of the flip-flop FF4 is set at the "H" level to conduct the N-channel MOS transistor NT0. Accordingly, the data line CB[0] is coupled to the ground voltage GND.

A memory cell column is selected by the column address signal CA. As an example, the case where the column address signal CA[0] is set at the "H" level is explained.

According to the setting, the bit-line pair BLP0 and the data-line pair CBP0 are electrically coupled. The bit line /BL[0] is set at the "L" level. Accordingly, the bit line BL[0] is coupled to the power supply voltage VDD with the aid of the write assist circuit 42.

When the word line WL[0] is selected, the memory node MB of the memory cell MC00 is set at the "L" level and the memory node MT is set at the "H" level to store data "1."

When the data D[0] is at the "L" level, the memory node MB of the memory cell MC00 is set at the "H" level and the memory node MT is set at the "L" level to store data "0."

The case where the mask data BWN[0] is set at the "H" level is explained. In this case, the mask data BWNL[0] ("H" level) is outputted to the flip-flop FF5. Accordingly, the output of the NAND circuit ND1 is set at the "H" level and the output of the NOR circuits NR0 and NR1 is also set at the "H" level. Therefore, the N-channel MOS transistors NT0 and NT1 are not conducted and the writing is prohibited.

(6) The Data Read in the Normal Mode

In the memory unit 3B, one of the eight word lines WL[0]-WL[7] is selected in response to the input of the address A[5:0] as an example. At the same time, in the memory unit 3B, one bit-line pair BLP of the four bit-line pairs BLP is selected.

When the word line WL[0] is selected and the bit-line pair BLP0 is selected, according to the address A[5:0] as an example, the data of the memory cell MC00 corresponding to the word line WL[0] is read.

In this case, the control signal RDE is set at the "H" level. Accordingly, the read circuit 44# operates. As an example, in the read circuit 44#, the inverter IV0 inverts the signal of the data line CT[0] according to the control signal RDE ("H" level), and outputs it to the latch circuit LT0. The latch circuit LT0 latches the output signal of the inverter IV0 and outputs it to the inverter IV1. The inverter IV1 inverts the signal from the latch circuit LT0 and outputs it as the read data Q[0]. The same applies to the other read circuits.

Accordingly, the read data Q[0], Q[1], and . . . of the multiple bits are read.

(7) The Data Write in the Test Mode

The data write to the memory cell MC00 is explained.

As an example, it is assumed that the test data TD[0] is set at the "L" level and the mask data TBWN[0] is set at the "L" level. The control signal BIST is set at the "H" level.

In this case, the IF control circuit 300 outputs the data DL[0] ("L" level) to the flip-flop FF4 and outputs the mask data BWNL[0] ("L" level) to the flip-flop FF5.

The flip-flops FF4 and FF5 latch data synchronizing with the clock signal CLK (not shown).

The IO control circuit 400 operates the write circuit 43 according to the control signal WTE ("H" level).

In the present example, the output of the flip-flop FF4 is set at the "L" level to conduct the N-channel MOS transistor NT1. Accordingly, the data line CT[0] is coupled to the ground voltage GND.

A memory cell column is selected by the column address signal CA. As an example, the case where the column address signal CA[0] is set at the "H" level is explained.

According to the setting, the bit-line pair BLP0 and the data-line pair CBP0 are electrically coupled. The bit line BL[0] is set at the "L" level. Accordingly, the bit line /BL[0] is coupled to the power supply voltage VDD with the aid of the write assist circuit 42.

When the word line WL[0] is selected, the memory node MB of the memory cell MC00 is set at the "H" level and the memory node MT is set at the "L" level to store data "0."

When the test data TD[0] is at the "H" level, the memory node MB of the memory cell MC00 is set at the "L" level and the memory node MT is set at the "H" level to store data "1."

The case where the mask data TBWN[0] is set at the "H" level is explained. In this case, the mask data BWNL[0] ("H" level) is outputted to the flip-flop FF5. Accordingly, the output of the NAND circuit ND1 is set at the "H" level and the output of the NOR circuits NR0 and NR1 is also set at the "H" level. Therefore, the N-channel MOS transistors NT0 and NT1 are not conducted, prohibiting the writing.

(8) The Data Read in the Test Mode

The memory unit 3B selects one of the eight word lines WL[0]-WL[7] in response to the input of the test address TA[5:0] as an example. At the same time, the memory unit 3B selects one bit-line pair of the four bit-line pairs BLP.

When the word line WL[0] is selected and the bit-line pair BLP0 is selected, according to the test address TA[5:0] as an example, the data of the memory cell MC00 corresponding to the word line WL[0] is read.

In this case, the control signal RDE is set at the "H" level. Accordingly, the read circuit 44# operates. As an example, in the read circuit 44#, the inverter IV0 inverts the signal of the data line CT[0] according to the control signal RDE ("H" level), and outputs it to the latch circuit LT0. The latch circuit LT0 latches the output signal of the inverter IV0 and outputs it to the inverter IV1#. The inverter IV1# inverts the signal from the latch circuit LT0 and outputs it as the read data TQ[0]. The same applies to the other read circuits.

Accordingly, the read data TQ[0], TQ[1], and . . . of the multiple bits are read.

The read data TQ[0], TQ[1], and . . . of the multiple bits are outputted to the BIST circuit 4.

In response to the read data in the test mode, the BIST circuit 4 performs data analysis to perform, the predetermined test determination processing.

Figure 12:
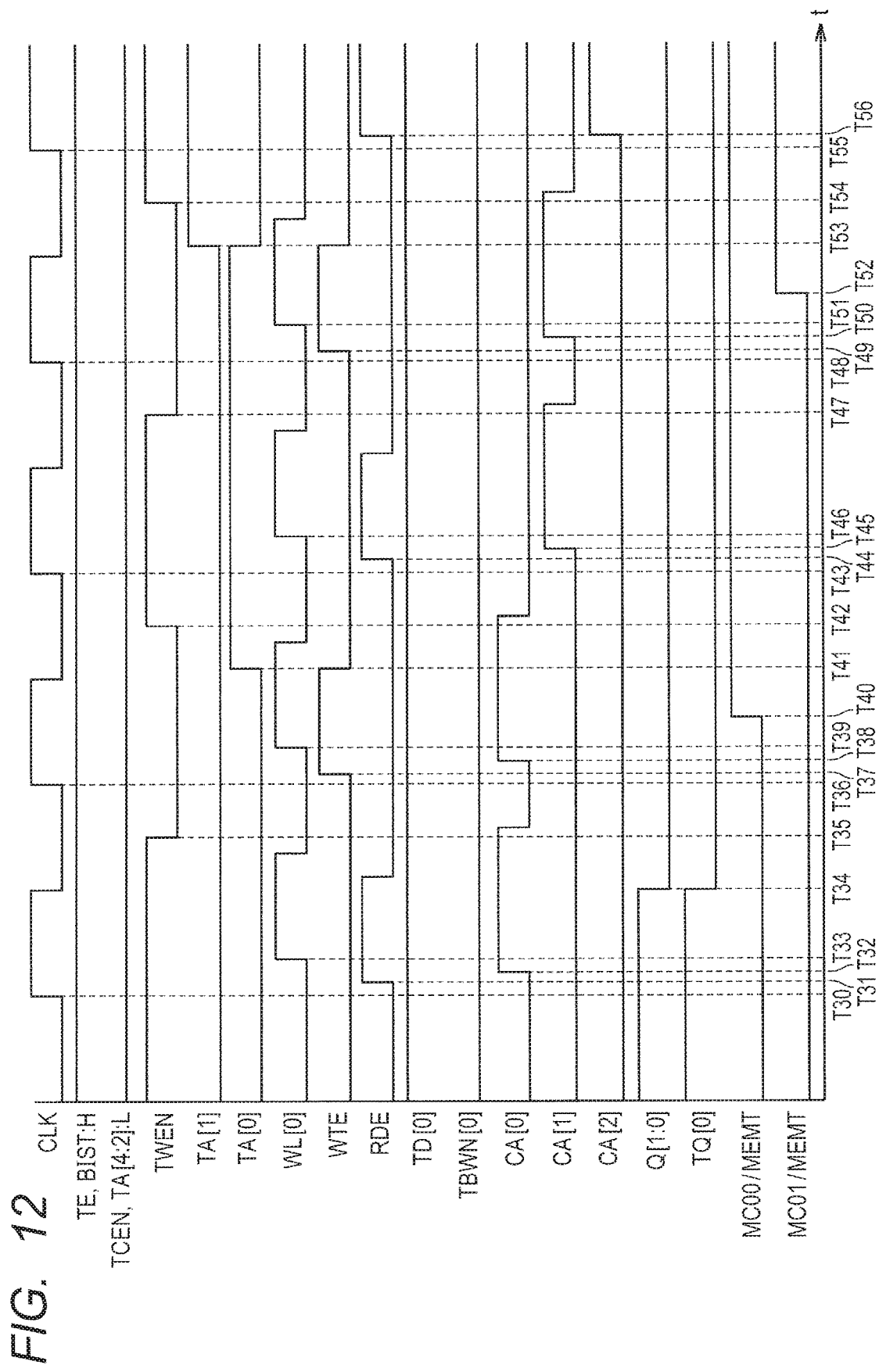
FIG. 12 is a timing chart illustrating operation of the memory unit 3B in the test mode according to the modified example of Embodiment 1.

FIG. 12 is a timing chart illustrating operation of the memory unit 3B in the test mode according to the modified example of Embodiment 1.

The present embodiment explains the marching test in which the data read and the data write are alternately performed.

The control signal TE is set at the "H" level. Therefore, the control signal HIST is set at the "H" level.

As illustrated in FIG. 12, the data read (read cycle) is first explained as an example.

The memory unit 3B operates synchronizing with the clock signal CLK. In the present example, the clock signal CLK rises at Time T30 as an example.

Synchronizing with the clock signal CLK, the control circuit 200 fetches the test address TA and the control signal, and outputs various kinds of control signals.

As an example, the test address TA[0] is set at the "L" level. Since the control signal TWEN is at the "H" level, the control signal RDE is set at the "H" level at Time T31. Accordingly, the data read is performed.

Next, at Time T32, the column address signal CA[0] is set at the "H" level.

Next, at Time T33, the word line WL[0] is selected ("H" level). Accordingly, the data read of the memory cell MC00 corresponding to the word line WL[0] and the bit-line pair BLP0 is performed.

The present example shows a case where at Time T34, the read data Q and TQ are outputted. Next, at Time T35, the control signal TWEN is set at the "L" level.

Next, at Time T36, synchronizing with the clock signal CLK, the test address TA and the control signal are fetched, and various kinds of control signals are outputted.

Since the control signal TWEN is at the "L" level, at Time T37, the control signal WTE is set at the "H" Level. Accordingly, the data write is performed.

Next, at Time T38, the column address signal CA[0] is set at the "H" level.

Next, at Time T39, the word line WL[0] is selected ("H" level). Accordingly, the data write of the memory cell MC00 corresponding to the word line WL[0] and the bit-line pair BLP0 is performed.

The present example shows a case where at Time T40, the data write to the memory cell MC00 is performed.

Next, the present example shows a case where at Time T41, the test address TA is incremented and the test address TA[0] is set at the "H" level.

Next, at Time T42, the control signal TWEN is set at the "H" level. At Time T43, synchronizing with the clock signal CLK, the control circuit 200 fetches the test address TA and the control signal, and outputs various kinds of control signals.

Since the control signal TWEN is at the "H" level, the control signal RDE is set at the "H" level at Time T44. Accordingly, the data read is performed.

Next, at Time T45, the column address signal CA[1] is set at the "H" level.

Next, at Time T46, the word line WL[0] is selected ("H" level). Accordingly, the data read of the memory cell MC01 corresponding to the word line WL[0] and the bit-line pair BLP1 is performed.

Next, at Time T47, the control signal TWEN is set at the "L" level. Next, at Time T48, synchronizing with the clock signal CLK, the control circuit 20 fetches the test address TA and the control signal, and outputs various kinds of control signals.

Since the control signal TWEN is at the "L" level, the control signal WTE is set at the "H" level at Time T49. Accordingly, the data write is performed.

Next, at Time T50, the column address signal CA[1] is set at the "H" level.

Next, at Time T51, the word line WL[0] is selected ("H" level). Accordingly, the data write of the memory dell MC01 corresponding to the word line WL[0] and the bit-line pair BLP1 is performed.

The present example shows a case where at Time T52, the data write to the memory cell MC01 is performed.

Next, the present example shows a case where at Time T53, the test address TA is incremented, and the test address TA[0] is set at the "L" level and the test address TAW is set at the "H" level.

Next, at Time T54, the control signal TWEN is set at the "H" level. At Time T55, synchronizing with the clock signal CLK, the control circuit 200 fetches the test address TA and the control signal, and outputs various kinds of control signals.

Since the control signal TWEN is at the "H" level, the control signal RDE is set at the "H" level at Time T56. Accordingly, the data read is performed.

Next, the data read of the memory cell MC02 corresponding to the word line WL[0] and the bit-line pair BLP2 is performed as an example.

It is possible to perform the marching test by repeating the processing concerned. Therefore, it is possible for the memory unit 3B (MUX4) to perform the marching test to detect the failure of an adjacent cell, by activating the column address signal CA one after the other.

It is possible to perform the marching test of the memory unit 3A in the same manner as the method explained for the memory 3.

Even when the memory unit 3A (MUX1) different from the memory unit 3B (MUX4) are mounted in the semiconductor chip 1#, as illustrated in FIG. 7, it is possible to test using the common BIST circuit 4. As for the memory unit 3A, it is also possible to use the same test pattern of the marching test as in the memory unit 3B.

Specifically, to the address A[m:0] that is used for the memory unit 3A (MUX1), the test address TA[m+1:0] is used by adding one bit to the test address.

As explained in Embodiment 1, the even-numbered memory cell column and the odd-numbered memory cell column are selected using one bit of the test address concerned.

By verifying the data read and the data write that are performed to the even-numbered memory cell column and the odd-numbered memory cell column alternately, it is possible to perform the marching test to detect the failure of the adjacent cell.

Therefore, it not necessary to provide an exclusive-use BIST circuit and an exclusive-use test pattern for the memory unit 3A, and the BIST circuit used in common with the memory unit 3B can be used. Accordingly, it is possible to reduce the area and to suppress the cost.

(Embodiment 2)

Figure 13:
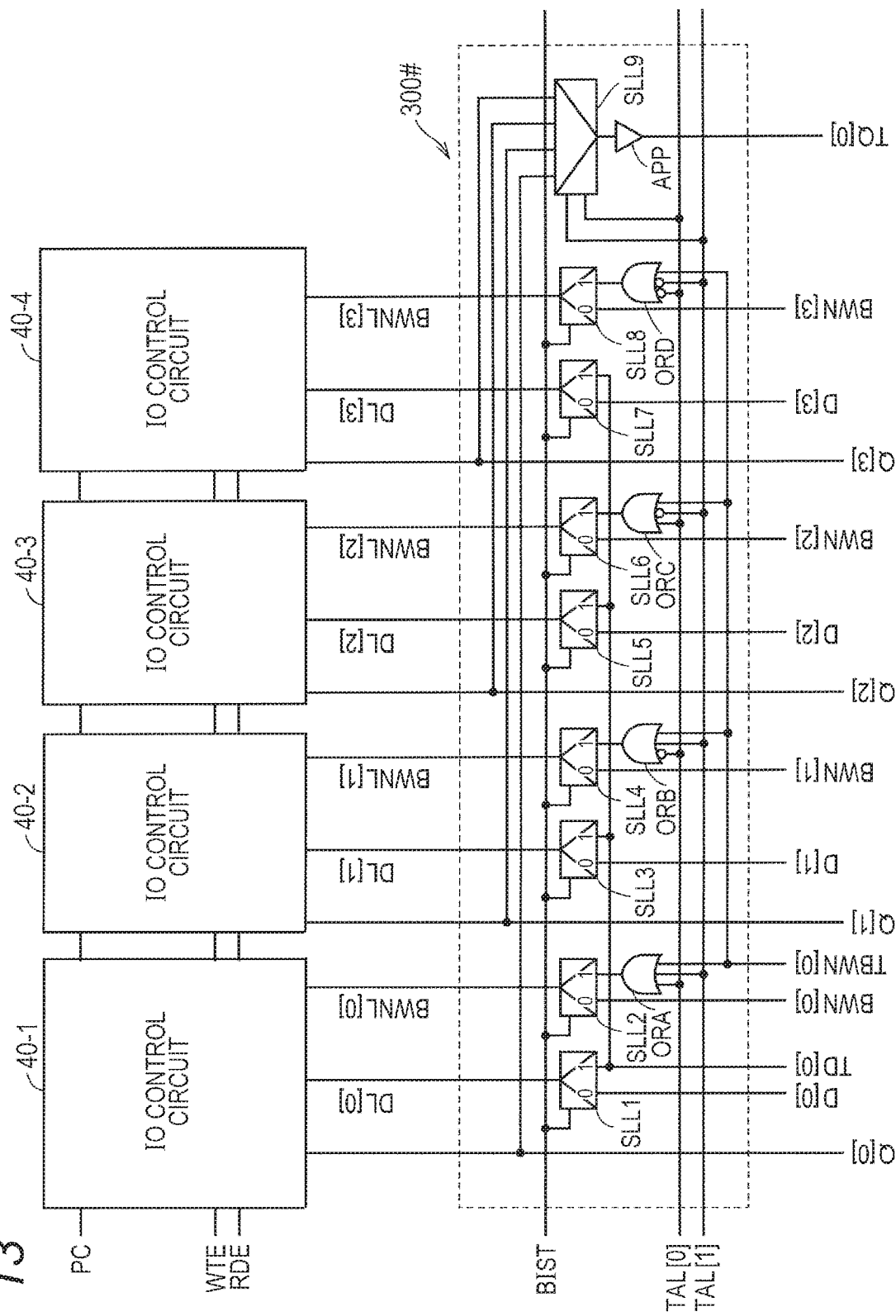
FIG. 13 is a drawing illustrating a circuit diagram of an IF control circuit 300# according to Embodiment 2.

FIG. 13 is a drawing illustrating a circuit diagram of an IF control circuit 300# according to Embodiment 2.

With reference to FIG. 13, the IF control circuit 300# is comprised of selectors SLL1-SLL9, OR circuits ORA, ORB, ORC, and ORD, and an amplifier APP.

The selector SLL1 outputs one of the data D[0] and the test data TD[0] that are inputted, to the IO control circuit 40-1 as the data DL[0] according to the input of the control signal BIST.

Specifically, the selector SLL1 outputs the data D[0] that is inputted, to the IO control circuit 40-1 as the data DL[0] according to the input of the control signal BIST ("L" level). On the other hand, the selector SLL1 outputs the test data TD[0] that is inputted, to the IO control circuit 40-1 as the data DL[0] according to the input of the control signal BIST ("H" level).

The OR circuit ORA outputs an OR logical operation result of the control signal TAL[0], the control signal TAL[1], and the mask data TBWN[0], to the selector SLL2.

The selector SLL2 outputs one of the mask data BWN[0] and the output of the OR circuit ORA that are inputted, to the IO control circuit 40-1 as the mask data BWNL[0] according to the input of the control signal BIST.

Specifically, the selector SLL2 outputs the mask data BWN[0] that is inputted, to the IO control circuit 40-1 as the mask data BWNL[0] according to the input of the control signal BIST ("L" level). On the other hand, the selector SLL2 outputs the output of the OR circuit ORA that is inputted, to the IO control circuit 40-1 as the mask data BWNL[0] according to the input of the control signal BIST ("H" level).

The selector SLL3 outputs one of the data D[1] and the test data TD[0] that are inputted, to the IO control circuit 40-2 as the data DL[1] according to the input of the control signal BIST.

Specifically, the selector SLL3 outputs the data D[1] that is inputted, to the IO control circuit 40-2 as the data DL[1] according to the input of the control signal BIST ("L" level). On the other hand, the selector SLL3 outputs the test data ID[0] that is inputted, to the IO control circuit 40-2 as the data DL[1] according to the input of the control signal BIST ("H" level).

The OR circuit ORB outputs an OR logical operation result of an inverted signal of the control signal TAL[0], the control signal TAL[1], and the mask data TBWN[0], to the selector SLL4.

The selector SLL4 outputs one of the mask data BWN[1] and the output of the OR circuit ORB that are inputted, to the IO control circuit 40-2 as the mask data BWNL[1] according to the input of the control signal BIST.

Specifically, the selector SLL4 outputs the mask data BWN[1] that is inputted, to the IO control circuit 40-2 as the mask data BWNL[1] according to the input of the control signal BIST ("L" level). On the other hand, the selector SLL4 outputs the output of the OR circuit ORB that is inputted, to the IO control circuit 40-2 as the mask data BWNL[1] according to the input of the control signal BIST ("H" level).

The selector SLL5 outputs one of the data D[2] and the test data TD[0] that are inputted, to the IO control circuit 40-3 as the data DL[2] according to the input of the control signal BIST.

Specifically, the selector SLL5 outputs the data D[2] that is inputted, to the IO control circuit 40-3 as the data DL[2] according to the input of the control signal BIST ("L" level). On the other hand, the selector SLL5 outputs the test data TD[0] that is inputted, to the IC control circuit 40-3 as the data DL[2] according to the Input of the control signal BIST ("H" level).

The OR circuit ORC outputs an OR logical operation result of the control signal TAL[0], an inverted signal of the control signal TAL[1], and the mask data TBWN[0], to the selector SLL6.

The selector SLL6 outputs one of the mask data BWN[2] and the output of the OR circuit ORC that are inputted, to the IO control circuit 40-3 as the mask data BWNL[2] according to the input of the control signal BIST.

Specifically, the selector SLL6 outputs the mask data BWN[2] that is inputted, to the IO control circuit 40-3 as the mask data BWNL[2] according to the input of the control signal BIST ("L" level). On the other hand, the selector SLL6 outputs the output of the OR circuit ORC that is inputted, to the IO control circuit 40-3 as the mask data BWNL[2] according to the input of the control signal BIST ("H" level).

The selector SLL7 outputs one of the data D[3] and the test data TD[0] that are inputted, to the IO control circuit 40-4 as the data DL[3] according to the input of the control signal BIST.

Specifically, the selector SLL7 outputs the data D[3] that is inputted, to the IO control circuit 40-4 as the data DL[3] according to the input of the control signal BIST ("L" level). On the other hand, the selector SLL7 outputs the test data TD[0] that is inputted, to the IC control circuit 40-4 as the data DL[3] according to the input of the control signal BIST ("H" level).

The OR circuit ORD outputs an OR logical operation result of an inverted signal of the control signal TAL[0], an inverted signal of the control signal TAL[1], and the mask data TBWN[0], to the selector SLL8.

The selector SLL8 outputs one of the mask data BWN[3] and the output of the OR circuit ORD that are inputted, to the IO control circuit 40-4 as the mask data BWNL[3] according to the input of the control signal BIST.

Specifically, the selector SLL8 outputs the mask data BWN[3] that is inputted, to the IO control circuit 40-4 as the mask data BWNL[3] according to the input of the control signal BIST ("L" level). On the other hand, the selector SLL8 outputs the output of the OR circuit ORD that is inputted, to the IO control circuit 40-4 as the mask data BWNL[3] according to the input of the control signal BIST ("H" level).

The selector SLL9 outputs one of the read data Q[0]-Q[3] that are inputted, to the amplifier APP according to the input of the control signals TAL[0] and TAL[1]. The amplifier APP amplifies the inputted signal and outputs it to the BIST circuit 4 as the read data TQ[0].

According to the configuration concerned, in the data write, when the control signal BIST is at the "H" level, one of the selectors SLL2, SLL4, SLL6, and SLL8 outputs the "L" level, and the remaining three selectors output the "H" level, based on the combination of the control signals TAL[0] and TAL[1]. Accordingly, one of the data DL[0]-DL[3] is inputted into one of the IO control circuits 40-1-40-4, thereby enabling to perform the data write.

Moreover, according to the configuration concerned, in the data read, one of the read data Q[0]-Q[3] is selected, based on the combination of the control signals TAL[0] and TAL[1]. Then, the output of the selector SLL9 is outputted as the read data TQ[0] via the amplifier APP.

The control signals TAL[0] and TAL[1] are generated based on the test addresses TA[0] and TA[1].

According to the present configuration, one column is selected from four columns by using the 2-bit test address.

Therefore, by applying the IF control circuit 300# concerned to the memory array MUX1 explained in Embodiment 1, it is possible to realize the same operation as the memory array MUX4. That is, the test based on the same test pattern as in the memory unit 3B explained in the modified example can be applied also to the memory array MUX1 with ease.

The present example explains the case where the 2-bit test address can be used. However, it is not restricted to the 2-bit test address. By using the test address of three or more bits, it is possible to perform the same test for the memory array MUX1 as in a memory array including multiple CPB bits. It is possible to improve the degree of freedom of the test by the BIST circuit 4.

It is possible to design the IF control circuit concerned as a hard macro cell, and it is also possible to realize the IF control circuit concerned by the RTL description using an FPGA, for example.

As described above, the present disclosure has been concretely explained based on the embodiments. However, it cannot be overemphasized that the present disclosure is not restricted to the embodiments as described above, and it can be changed variously or modified partly in the range which does not deviate from the gist.

What is claimed is:

1. A semiconductor device comprising:
   a memory cell array with a plurality of memory cells arranged in a matrix, the plurality of memory cells including a first memory cell in a first memory cell column and a second memory cell in a second memory cell column adjacent to the first memory cell column;
   a plurality of bit-line pairs provided for each memory cell column in the memory cell array;
   a plurality of input/output circuits provided respectively corresponding to the bit-line pairs, the plurality of input/output circuits including a first input/output circuit corresponding to the first memory cell column and a second input/output circuit corresponding to the second memory cell column; and
   an interface control circuit controlling a data input/output to the input/output circuits when executing data write and data read to each memory cell row in a normal mode,
   wherein the interface control circuit comprises a selection circuit selecting, according to a test address, a data input/output to one of the first input/output circuit and the second input/output circuit alternately when executing the data write and data read to each memory cell row in a test mode.

2. The semiconductor device according to claim 1,
   wherein, in the test mode, according to the test address, the selection circuit selects one of a first output signal and a second output signal as a test output signal, the first output signal being outputted from the first input/output circuit and the second output signal being outputted from the second input/output circuit.

3. The semiconductor device according to claim 1,
   wherein, in the test mode, according to the test address, the selection circuit selects one of a first input signal and a second input signal as a test input signal, the first input signal being inputted to the first input/output circuit and the second input signal being inputted to the second input/output circuit.

4. The semiconductor device according to claim 1,
   wherein the first input/output circuit comprises:
   a first read circuit to output a read signal from the first memory cell according to a read control signal, and
   wherein the second input/output circuit comprises:
   a second read circuit to output a read signal from the second memory cell
   according to the read control signal.

5. The semiconductor device according to claim 1,
   wherein the first input/output circuit comprises:
   a first write circuit to output a write signal corresponding to write data to the first memory cell according to a write control signal, and
   wherein the second input/output circuit comprises:
   a second write circuit to output a write signal corresponding to write data to the
   second memory cell according to the write control signal.

6. The semiconductor device according to claim 5,
   wherein the interface control circuit comprises:
   a first selector and a second selector to output respectively to the first write circuit and the second write circuit one of test data and ordinary data as the write data according to a test control signal.

7. The semiconductor device according to claim 6,
   wherein the first selector and the second selector receives the input of the test data via a common signal line.

8. The semiconductor device according to claim 7,
   wherein the interface control circuit comprises:
   a third selector to output one of the test address and first mask data and to control the activation/non-activation of the first write circuit according to the test control signal; and
   a fourth selector to output one of inverted data of the test address and second mask data and to control the activation/non-activation of the second write circuit according to the test control signal, and
   wherein, in the test mode, the third selector and the fourth selector output respectively the test address and the inverted data of the test address to the first write circuit and the second write circuit according to the test control signal.

9. The semiconductor device according to claim 1 further comprising: a test circuit to execute a marching test to the memory cell array.

\* \* \* \* \*